United States Patent
Berry et al.

(10) Patent No.: US 7,723,210 B2
(45) Date of Patent: May 25, 2010

(54) DIRECT-WRITE WAFER LEVEL CHIP SCALE PACKAGE

(75) Inventors: Christopher John Berry, Chandler, AZ (US); Ronald Patrick Huemoeller, Chandler, AZ (US); David Jon Hiner, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 207 days.

(21) Appl. No.: 11/810,799

(22) Filed: Jun. 6, 2007

(65) Prior Publication Data

US 2007/0241446 A1 Oct. 18, 2007

Related U.S. Application Data

(63) Continuation of application No. 11/289,826, filed on Nov. 29, 2005, now abandoned.

(51) Int. Cl.
*H01L 21/00* (2006.01)

(52) U.S. Cl. .................................................. 438/460

(58) Field of Classification Search ................. 438/460
See application file for complete search history.

(56) References Cited

U.S. PATENT DOCUMENTS

| | | | |
|---|---|---|---|
| 2,596,993 A | 5/1952 | Gookin | 18/36 |
| 3,435,815 A | 4/1969 | Forcier | 125/16 |
| 3,734,660 A | 5/1973 | Davies et al. | 425/123 |
| 3,838,984 A | 10/1974 | Crane et al. | 29/193.5 |
| 4,054,238 A | 10/1977 | Lloyd et al. | 228/173 R |
| 4,189,342 A | 2/1980 | Kock | 156/656 |
| 4,258,381 A | 3/1981 | Inaba | 357/70 |
| 4,289,922 A | 9/1981 | Devlin | 174/52 FP |
| 4,301,464 A | 11/1981 | Otsuki et al. | 357/70 |
| 4,332,537 A | 6/1982 | Slepcevic | 425/121 |
| 4,417,266 A | 11/1983 | Grabbe | 357/80 |
| 4,451,224 A | 5/1984 | Harding | 425/548 |
| 4,530,152 A | 7/1985 | Roche et al. | 29/588 |
| 4,541,003 A | 9/1985 | Otsuka et al. | 357/74 |
| 4,646,710 A | 3/1987 | Schmid et al. | 125/16 R |
| 4,707,724 A | 11/1987 | Suzuki et al. | 357/71 |
| 4,727,633 A | 3/1988 | Herrick | 228/122 |
| 4,729,061 A | 3/1988 | Brown | |
| 4,737,839 A | 4/1988 | Burt | 357/67 |
| 4,756,080 A | 7/1988 | Thorp, Jr. et al. | 29/827 |

(Continued)

FOREIGN PATENT DOCUMENTS

DE 197 34 794 7/1998

(Continued)

OTHER PUBLICATIONS

Berry et al., "Thin Stacked Interposer Package", U.S. Appl. No. 11/865,617, filed Oct. 1, 2007.
Scanlan, "Package-on-package (PoP) with Through-mold Vias", *Advanced Packaging*, Jan. 2008, 3 pages, vol. 17, Issue 1, PennWell Corporation.
Kim et al., "Application of Through Mold Via (TMV) as PoP base package", *58th ECTC Proceedings*, May 2008, Lake Buena Vista, FL, 6 pages, IEEE.

(Continued)

*Primary Examiner*—Kenneth A Parker
*Assistant Examiner*—Anthony Ho
(74) *Attorney, Agent, or Firm*—Gunnison, McKay & Hodgson, L.L.P.; Serge J. Hodgson

(57) ABSTRACT

A method and structure provides a Direct Write Wafer Level Chip Scale Package (DWWLCSP) that utilizes permanent layers/coatings and direct write techniques to pattern these layers/coatings, thereby avoiding the use of photoimagable materials and photo-etching processes.

14 Claims, 13 Drawing Sheets

U.S. PATENT DOCUMENTS

| | | | |
|---|---|---|---|
| 4,812,896 A | 3/1989 | Rothgery et al. | 357/70 |
| 4,862,245 A | 8/1989 | Pashby et al. | 357/70 |
| 4,862,246 A | 8/1989 | Masuda et al. | 357/70 |
| 4,907,067 A | 3/1990 | Derryberry | 357/74 |
| 4,920,074 A | 4/1990 | Shimizu et al. | 437/211 |
| 4,935,803 A | 6/1990 | Kalfus et al. | 357/68 |
| 4,942,454 A | 7/1990 | Mori et al. | 357/70 |
| 4,987,475 A | 1/1991 | Schlesinger et al. | 357/70 |
| 5,018,003 A | 5/1991 | Yasunaga et al. | 357/72 |
| 5,029,386 A | 7/1991 | Chao et al. | 29/827 |
| 5,041,902 A | 8/1991 | McShane | 357/79 |
| 5,057,900 A | 10/1991 | Yamazaki | 357/70 |
| 5,059,379 A | 10/1991 | Tsutsumi et al. | 264/272.14 |
| 5,065,223 A | 11/1991 | Matsuki et al. | 357/68 |
| 5,070,039 A | 12/1991 | Johnson et al. | 437/207 |
| 5,087,961 A | 2/1992 | Long et al. | 357/69 |
| 5,091,341 A | 2/1992 | Asada et al. | 437/212 |
| 5,096,852 A | 3/1992 | Hobson | 437/207 |
| 5,118,298 A | 6/1992 | Murphy | 439/68 |
| 5,122,860 A | 6/1992 | Kikuchi et al. | 357/72 |
| 5,134,773 A | 8/1992 | LeMaire et al. | 29/827 |
| 5,151,039 A | 9/1992 | Murphy | 439/70 |
| 5,157,475 A | 10/1992 | Yamaguchi | 357/68 |
| 5,157,480 A | 10/1992 | McShane et al. | 357/74 |
| 5,168,368 A | 12/1992 | Gow, 3rd et al. | 257/666 |
| 5,172,213 A | 12/1992 | Zimmerman | 257/796 |
| 5,172,214 A | 12/1992 | Casto | 257/676 |
| 5,175,060 A | 12/1992 | Enomoto et al. | 428/620 |
| 5,200,362 A | 4/1993 | Lin et al. | 437/207 |
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,218,231 A | 6/1993 | Kudo | 257/735 |
| 5,221,642 A | 6/1993 | Burns | 437/207 |
| 5,250,841 A | 10/1993 | Sloan et al. | 257/666 |
| 5,252,853 A | 10/1993 | Michii | 257/666 |
| 5,258,094 A | 11/1993 | Furui et al. | 156/634 |
| 5,266,834 A | 11/1993 | Nishi et al. | 257/706 |
| 5,268,310 A | 12/1993 | Goodrich et al. | 437/15 |
| 5,273,938 A | 12/1993 | Lin et al. | 437/207 |
| 5,277,972 A | 1/1994 | Sakumoto et al. | 428/355 |
| 5,278,446 A | 1/1994 | Nagaraj et al. | 257/707 |
| 5,279,029 A | 1/1994 | Burns | 29/856 |
| 5,281,849 A | 1/1994 | Singh Deo et al. | 257/666 |
| 5,294,897 A | 3/1994 | Notani et al. | 333/33 |
| 5,327,008 A | 7/1994 | Djennas et al. | 257/666 |
| 5,332,864 A | 7/1994 | Liang et al. | 174/52.4 |
| 5,335,771 A | 8/1994 | Murphy | 206/328 |
| 5,336,931 A | 8/1994 | Juskey et al. | 257/787 |
| 5,343,076 A | 8/1994 | Katayama et al. | 257/717 |
| 5,353,498 A | 10/1994 | Fillion et al. | 29/840 |
| 5,358,905 A | 10/1994 | Chiu | 437/209 |
| 5,365,106 A | 11/1994 | Watanabe | 257/669 |
| 5,381,042 A | 1/1995 | Lerner et al. | 257/712 |
| 5,391,439 A | 2/1995 | Tomita et al. | 428/571 |
| 5,394,303 A | 2/1995 | Yamaji | 361/749 |
| 5,406,124 A | 4/1995 | Morita et al. | 257/783 |
| 5,410,180 A | 4/1995 | Fujii et al. | 257/666 |
| 5,414,299 A | 5/1995 | Wang et al. | 257/702 |
| 5,417,905 A | 5/1995 | Lemaire et al. | 264/139 |
| 5,424,576 A | 6/1995 | Djennas et al. | 257/666 |
| 5,428,248 A | 6/1995 | Cha | 257/676 |
| 5,432,677 A | 7/1995 | Mowatt et al. | |
| 5,435,057 A | 7/1995 | Bindra et al. | 29/830 |
| 5,444,301 A | 8/1995 | Song et al. | 257/737 |
| 5,452,511 A | 9/1995 | Chang | 29/827 |
| 5,454,905 A | 10/1995 | Fogelson | 156/651.1 |
| 5,474,958 A | 12/1995 | Djennas et al. | 437/211 |
| 5,484,274 A | 1/1996 | Neu | 425/116 |
| 5,493,151 A | 2/1996 | Asada et al. | 257/686 |
| 5,508,556 A | 4/1996 | Lin | 257/691 |
| 5,517,056 A | 5/1996 | Bigler et al. | 257/666 |
| 5,521,429 A | 5/1996 | Aono et al. | 257/676 |
| 5,528,076 A | 6/1996 | Pavio | 257/666 |
| 5,534,467 A | 7/1996 | Rostoker | 437/209 |
| 5,539,251 A | 7/1996 | Iverson et al. | 257/670 |
| 5,543,657 A | 8/1996 | Diffenderfer et al. | 257/666 |
| 5,544,412 A | 8/1996 | Romero et al. | 29/832 |
| 5,545,923 A | 8/1996 | Barber | 257/691 |
| 5,576,517 A | 11/1996 | Wojnarowski et al. | 174/262 |
| 5,578,525 A | 11/1996 | Mizukoshi | |
| 5,581,122 A | 12/1996 | Chao et al. | 257/691 |
| 5,592,019 A | 1/1997 | Ueda et al. | 257/666 |
| 5,592,025 A | 1/1997 | Clark et al. | 257/774 |
| 5,594,274 A | 1/1997 | Suetaki | 257/667 |
| 5,595,934 A | 1/1997 | Kim | 437/180 |
| 5,604,376 A | 2/1997 | Hamburgen et al. | 257/666 |
| 5,608,265 A | 3/1997 | Kitano et al. | 257/738 |
| 5,608,267 A | 3/1997 | Mahulikar et al. | 257/796 |
| 5,619,068 A | 4/1997 | Benzoni | 257/690 |
| 5,625,222 A | 4/1997 | Yoneda et al. | 257/687 |
| 5,633,528 A | 5/1997 | Abbott et al. | 257/666 |
| 5,639,990 A | 6/1997 | Nishihara et al. | 174/52.2 |
| 5,640,047 A | 6/1997 | Nakashima | 257/738 |
| 5,641,997 A | 6/1997 | Ohta et al. | 257/788 |
| 5,643,433 A | 7/1997 | Fukase et al. | 205/78 |
| 5,644,169 A | 7/1997 | Chun | 257/787 |
| 5,646,831 A | 7/1997 | Manteghi | 361/813 |
| 5,650,663 A | 7/1997 | Parthasarathi | 257/706 |
| 5,661,088 A | 8/1997 | Tessier et al. | 29/841 |
| 5,665,996 A | 9/1997 | Williams et al. | 257/401 |
| 5,673,479 A | 10/1997 | Hawthorne | 29/832 |
| 5,683,806 A | 11/1997 | Sakumoto et al. | 428/343 |
| 5,689,135 A | 11/1997 | Ball | 257/676 |
| 5,696,666 A | 12/1997 | Miles et al. | 361/764 |
| 5,701,034 A | 12/1997 | Marrs | 257/706 |
| 5,703,407 A | 12/1997 | Hori | 257/783 |
| 5,710,064 A | 1/1998 | Song et al. | 437/220 |
| 5,723,899 A | 3/1998 | Shin | 257/666 |
| 5,724,233 A | 3/1998 | Honda et al. | 361/813 |
| 5,726,493 A | 3/1998 | Yamashita et al. | 257/698 |
| 5,736,432 A | 4/1998 | Mackessy | 438/123 |
| 5,736,448 A | 4/1998 | Saia et al. | 438/393 |
| 5,745,984 A | 5/1998 | Cole, Jr. et al. | 29/834 |
| 5,753,532 A | 5/1998 | Sim | 437/217 |
| 5,753,977 A | 5/1998 | Kusaka et al. | 257/787 |
| 5,766,972 A | 6/1998 | Takahashi et al. | 438/127 |
| 5,769,989 A | 6/1998 | Hoffmeyer et al. | 156/94 |
| 5,770,888 A | 6/1998 | Song et al. | 257/696 |
| 5,776,798 A | 7/1998 | Quan et al. | 438/112 |
| 5,783,861 A | 7/1998 | Son | 253/693 |
| 5,786,238 A | 7/1998 | Pai et al. | 438/118 |
| 5,801,440 A | 9/1998 | Chu et al. | 257/691 |
| 5,814,877 A | 9/1998 | Diffenderfer et al. | 257/666 |
| 5,814,881 A | 9/1998 | Alagaratnam et al. | 257/686 |
| 5,814,883 A | 9/1998 | Sawai et al. | 257/712 |
| 5,814,884 A | 9/1998 | Davis et al. | 257/723 |
| 5,817,540 A | 10/1998 | Wark | 438/107 |
| 5,818,105 A | 10/1998 | Kouda | 257/696 |
| 5,821,457 A | 10/1998 | Mosley et al. | 174/52.4 |
| 5,821,615 A | 10/1998 | Lee | 257/686 |
| 5,834,830 A | 11/1998 | Cho | 257/667 |
| 5,835,988 A | 11/1998 | Ishii | 257/684 |
| 5,841,193 A | 11/1998 | Eichelberger | 257/723 |
| 5,844,306 A | 12/1998 | Fujita et al. | 257/676 |
| 5,856,911 A | 1/1999 | Riley | 361/704 |
| 5,859,471 A | 1/1999 | Kuraishi et al. | 257/666 |
| 5,859,475 A | 1/1999 | Freyman et al. | |
| 5,866,939 A | 2/1999 | Shin et al. | 257/666 |
| 5,871,782 A | 2/1999 | Choi | 425/116 |
| 5,874,770 A | 2/1999 | Saia et al. | 257/536 |
| 5,874,784 A | 2/1999 | Aoki et al. | 257/787 |
| 5,877,043 A | 3/1999 | Alcoe et al. | 438/123 |
| 5,886,397 A | 3/1999 | Ewer | 257/667 |

| | | | | | | | |
|---|---|---|---|---|---|---|---|
| 5,886,398 | A | 3/1999 | Low et al. ............... 257/667 | 6,225,146 | B1 | 5/2001 | Yamaguchi et al. ......... 438/123 |
| 5,894,108 | A | 4/1999 | Mostafazadeh et al. .... 174/52.4 | 6,229,200 | B1 | 5/2001 | Mclellan et al. ............. 257/666 |
| 5,897,339 | A | 4/1999 | Song et al. ................ 438/118 | 6,229,205 | B1 | 5/2001 | Jeong et al. ................. 257/676 |
| 5,900,676 | A | 5/1999 | Kweon et al. .............. 257/787 | 6,239,367 | B1 | 5/2001 | Hsuan et al. ................ 174/52.4 |
| 5,903,049 | A | 5/1999 | Mori .......................... 257/686 | 6,239,384 | B1 | 5/2001 | Smith et al. ................. 174/261 |
| 5,903,050 | A | 5/1999 | Thurairajaratnam et al. 257/695 | 6,242,281 | B1 | 6/2001 | Mclellan et al. ............. 438/106 |
| 5,909,053 | A | 6/1999 | Fukase et al. .............. 257/666 | 6,256,200 | B1 | 7/2001 | Lam et al. ................... 361/704 |
| 5,915,998 | A | 6/1999 | Stidham et al. ............. 439/723 | 6,258,192 | B1 | 7/2001 | Natarajan ................ 156/89.15 |
| 5,917,242 | A | 6/1999 | Ball ............................ 257/737 | 6,258,629 | B1 | 7/2001 | Niones et al. ............... 438/111 |
| 5,937,324 | A | 8/1999 | Abercrombie et al. ...... 438/648 | 6,261,918 | B1 | 7/2001 | So .............................. 438/401 |
| 5,939,779 | A | 8/1999 | Kim ............................ 257/692 | 6,281,566 | B1 | 8/2001 | Magni ........................ 257/666 |
| 5,942,794 | A | 8/1999 | Okumura et al. ............ 257/666 | 6,281,568 | B1 | 8/2001 | Glenn et al. ................ 257/684 |
| 5,951,305 | A | 9/1999 | Haba ........................ 439/70 | 6,282,095 | B1 | 8/2001 | Houghton et al. ........... 361/704 |
| 5,959,356 | A | 9/1999 | Oh .............................. 257/738 | 6,285,075 | B1 | 9/2001 | Combs et al. ............... 257/675 |
| 5,969,426 | A | 10/1999 | Baba et al. .................. 257/778 | 6,291,271 | B1 | 9/2001 | Lee et al. ................... 438/121 |
| 5,973,388 | A | 10/1999 | Chew et al. ................ 257/676 | 6,291,273 | B1 | 9/2001 | Miyaki et al. ............... 438/123 |
| 5,976,912 | A | 11/1999 | Fukutomi et al. ........... 438/110 | 6,294,100 | B1 | 9/2001 | Fan et al. ..................... 216/14 |
| 5,977,613 | A | 11/1999 | Takata et al. ............... 257/666 | 6,294,830 | B1 | 9/2001 | Fjelstad ....................... 257/724 |
| 5,977,615 | A | 11/1999 | Yamaguchi et al. ......... 257/666 | 6,295,977 | B1 | 10/2001 | Ripper et al. ............. 125/16.02 |
| 5,977,630 | A | 11/1999 | Woodworth et al. ........ 257/712 | 6,297,548 | B1 | 10/2001 | Moden et al. ............... 257/686 |
| 5,981,314 | A | 11/1999 | Glenn et al. ................ 438/127 | 6,303,984 | B1 | 10/2001 | Corisis ........................ 257/670 |
| 5,982,632 | A | 11/1999 | Mosley et al. ............... 361/775 | 6,303,997 | B1 | 10/2001 | Lee .............................. 257/778 |
| 5,986,333 | A | 11/1999 | Nakamura ................... 257/667 | 6,307,272 | B1 | 10/2001 | Takahashi et al. ........... 257/787 |
| 5,986,885 | A | 11/1999 | Wyland ....................... 361/704 | 6,309,909 | B1 | 10/2001 | Ohgiyama .................... 438/112 |
| 6,001,671 | A | 12/1999 | Fjelstad ....................... 438/112 | 6,316,822 | B1 | 11/2001 | Venkateshwaran et al. .. 257/666 |
| 6,013,947 | A | 1/2000 | Lim ............................. 257/685 | 6,316,838 | B1 | 11/2001 | Ozawa et al. ............... 257/778 |
| 6,018,189 | A | 1/2000 | Mizuno ....................... 257/668 | 6,323,550 | B1 | 11/2001 | Martin et al. ................ 257/704 |
| 6,020,625 | A | 2/2000 | Qin et al. .................... 257/666 | 6,326,243 | B1 | 12/2001 | Suzuya et al. ............... 438/124 |
| 6,025,640 | A | 2/2000 | Yagi et al. ................... 257/666 | 6,326,244 | B1 | 12/2001 | Brooks et al. ............... 438/124 |
| 6,031,279 | A | 2/2000 | Lenz ........................... 257/666 | 6,326,678 | B1 | 12/2001 | Karnezos et al. ............ 257/666 |
| RE36,613 | E | 3/2000 | Ball ............................ 257/777 | 6,335,564 | B1 | 1/2002 | Pour ............................ 257/666 |
| 6,034,423 | A | 3/2000 | Mostafazadeh et al. ...... 257/691 | 6,337,510 | B1 | 1/2002 | Chun-Jen et al. ............ 257/666 |
| 6,040,626 | A | 3/2000 | Cheah et al. ................ 257/735 | 6,339,255 | B1 | 1/2002 | Shin ............................ 257/686 |
| 6,043,430 | A | 3/2000 | Chun ........................ 174/52.4 | 6,348,726 | B1 | 2/2002 | Bayan et al. ................. 257/666 |
| 6,060,768 | A | 5/2000 | Hayashida et al. ........... 257/666 | 6,355,502 | B1 | 3/2002 | Kang et al. .................. 438/110 |
| 6,060,769 | A | 5/2000 | Wark ........................... 257/666 | 6,365,974 | B1 | 4/2002 | Abbott et al. ............... 257/774 |
| 6,072,228 | A | 6/2000 | Hinkle et al. ................ 257/666 | 6,369,447 | B2 | 4/2002 | Mori ........................... 257/777 |
| 6,075,284 | A | 6/2000 | Choi et al. ................... 257/676 | 6,369,454 | B1 | 4/2002 | Chung ........................ 257/787 |
| 6,081,029 | A | 6/2000 | Yamaguchi .................. 257/718 | 6,373,127 | B1 | 4/2002 | Baudouin et al. ........... 257/676 |
| 6,084,310 | A | 7/2000 | Mizuno et al. .............. 257/779 | 6,380,048 | B1 | 4/2002 | Boon et al. .................. 438/456 |
| 6,087,715 | A | 7/2000 | Sawada et al. .............. 257/666 | 6,384,472 | B1 | 5/2002 | Huang ........................ 257/680 |
| 6,087,722 | A | 7/2000 | Lee et al. ..................... 257/723 | 6,388,336 | B1 | 5/2002 | Venkateshwaran et al. .. 257/779 |
| 6,100,594 | A | 8/2000 | Fukui et al. ................. 257/777 | 6,395,578 | B1 | 5/2002 | Shin et al. .................... 438/106 |
| 6,113,474 | A | 9/2000 | Shih et al. .................... 451/72 | 6,396,148 | B1 | 5/2002 | Eichelberger et al. ....... 257/758 |
| 6,114,752 | A | 9/2000 | Huang et al. ................ 257/666 | 6,396,153 | B2 | 5/2002 | Fillion et al. ................ 257/774 |
| 6,118,174 | A | 9/2000 | Kim ............................ 257/676 | 6,400,004 | B1 | 6/2002 | Fan et al. ..................... 257/666 |
| 6,118,184 | A | 9/2000 | Ishio et al. ................... 257/787 | 6,410,979 | B2 | 6/2002 | Abe ............................. 257/684 |
| RE36,907 | E | 10/2000 | Templeton, Jr. et al. ...... 257/666 | 6,414,385 | B1 | 7/2002 | Huang et al. ................ 257/690 |
| 6,130,115 | A | 10/2000 | Okumura et al. ............ 438/124 | 6,420,779 | B1 | 7/2002 | Sharma et al. ............... 257/666 |
| 6,130,473 | A | 10/2000 | Mostafazadeh et al. ..... 257/666 | 6,429,508 | B1 | 8/2002 | Gang .......................... 257/678 |
| 6,133,623 | A | 10/2000 | Otsuki et al. ................ 257/666 | 6,437,429 | B1 | 8/2002 | Su et al. ...................... 257/666 |
| 6,140,154 | A | 10/2000 | Hinkle et al. ................ 438/123 | 6,444,499 | B1 | 9/2002 | Swiss et al. .................. 438/127 |
| 6,143,981 | A | 11/2000 | Glenn ........................ 174/52.4 | 6,448,633 | B1 | 9/2002 | Yee et al. ..................... 257/666 |
| 6,169,329 | B1 | 1/2001 | Farnworth et al. ........... 257/780 | 6,452,279 | B2 | 9/2002 | Shimoda ...................... 257/777 |
| 6,177,718 | B1 | 1/2001 | Kozono ....................... 257/666 | 6,459,148 | B1 | 10/2002 | Chun-Jen et al. ............ 257/692 |
| 6,181,002 | B1 | 1/2001 | Juso et al. ................... 257/686 | 6,464,121 | B2 | 10/2002 | Reijnders .................... 225/103 |
| 6,184,465 | B1 | 2/2001 | Corisis ........................ 174/52.4 | 6,476,469 | B2 | 11/2002 | Hung et al. .................. 257/676 |
| 6,184,573 | B1 | 2/2001 | Pu ............................... 257/666 | 6,476,474 | B1 | 11/2002 | Hung ........................... 257/686 |
| 6,194,250 | B1 | 2/2001 | Melton et al. | 6,482,680 | B1 | 11/2002 | Khor et al. ................... 438/123 |
| 6,194,777 | B1 | 2/2001 | Abbott et al. ............... 257/666 | 6,498,099 | B1 | 12/2002 | McLellan et al. ............. 438/689 |
| 6,197,615 | B1 | 3/2001 | Song et al. ................... 438/111 | 6,498,392 | B2 | 12/2002 | Azuma ........................ 257/676 |
| 6,198,171 | B1 | 3/2001 | Huang et al. ................ 257/787 | 6,507,096 | B2 | 1/2003 | Gang .......................... 257/678 |
| 6,201,186 | B1 | 3/2001 | Daniels et al. ............. 174/52.4 | 6,507,120 | B2 | 1/2003 | Lo et al. ...................... 257/778 |
| 6,201,292 | B1 | 3/2001 | Yagi et al. ................... 257/666 | 6,521,530 | B2 | 2/2003 | Peters et al. ................. 438/667 |
| 6,204,554 | B1 | 3/2001 | Ewer et al. .................. 257/705 | 6,524,885 | B2 | 2/2003 | Pierce ......................... 438/106 |
| 6,208,020 | B1 | 3/2001 | Minamio et al. ............. 257/684 | 6,534,849 | B1 | 3/2003 | Gang .......................... 257/678 |
| 6,208,021 | B1 | 3/2001 | Ohuchi et al. ............... 257/690 | 6,545,332 | B2 | 4/2003 | Huang ........................ 257/433 |
| 6,208,023 | B1 | 3/2001 | Nakayama et al. ........... 257/696 | 6,545,345 | B1 | 4/2003 | Glenn et al. ................. 257/676 |
| 6,211,462 | B1 | 4/2001 | Carter, Jr. et al. ........... 174/52.4 | 6,559,525 | B2 | 5/2003 | Huang ........................ 257/675 |
| 6,214,525 | B1 | 4/2001 | Boyko et al. | 6,566,168 | B2 | 5/2003 | Gang .......................... 438/112 |
| 6,218,731 | B1 | 4/2001 | Huang et al. ................ 257/738 | 6,583,503 | B2 | 6/2003 | Akram et al. ................ 257/686 |
| 6,222,258 | B1 | 4/2001 | Asano et al. ................ 257/675 | 6,593,645 | B2 | 7/2003 | Shih et al. ................... 257/686 |
| 6,222,259 | B1 | 4/2001 | Park et al. ................... 257/690 | 6,603,196 | B2 | 8/2003 | Lee et al. ..................... 257/676 |

| | | | | | |
|---|---|---|---|---|---|
| 6,624,005 B1 | 9/2003 | DiCaprio et al. ............. 438/113 | JP | 62-009639 | 1/1987 |
| 6,667,546 B2 | 12/2003 | Huang et al. ................. 257/691 | JP | 63-033854 | 2/1988 |
| 6,671,398 B2 | 12/2003 | Reinhorn et al. ............ 382/145 | JP | 63-067762 | 3/1988 |
| 6,727,576 B2 | 4/2004 | Hedler et al. ................ 257/678 | JP | 63-188964 | 8/1988 |
| 6,730,857 B2 | 5/2004 | Konrad et al. | JP | 63-205935 | 8/1988 |
| 6,740,964 B2 | 5/2004 | Sasaki | JP | 63-233555 | 9/1988 |
| 6,831,371 B1 | 12/2004 | Huemoeller et al. ......... 257/778 | JP | 63-249345 | 10/1988 |
| 6,838,776 B2 | 1/2005 | Leal et al. .................... 257/783 | JP | 63-289951 | 11/1988 |
| 6,845,554 B2 | 1/2005 | Frankowsky et al. .......... 29/832 | JP | 63-316470 | 12/1988 |
| 6,905,914 B1 | 6/2005 | Huemoeller et al. ......... 438/118 | JP | 64-054749 | 3/1989 |
| 6,919,514 B2 | 7/2005 | Konrad et al. | JP | 01-106456 | 4/1989 |
| 6,921,975 B2 | 7/2005 | Leal et al. .................... 257/723 | JP | 01-175250 | 7/1989 |
| 6,930,256 B1 | 8/2005 | Huemoeller et al. ......... 174/260 | JP | 01-205544 | 8/1989 |
| 7,015,075 B2 | 3/2006 | Fay et al. ..................... 438/127 | JP | 01-251747 | 10/1989 |
| 7,041,534 B2 | 5/2006 | Chao et al. ................... 438/114 | JP | 02-129948 | 5/1990 |
| 7,129,158 B2 | 10/2006 | Nakai | JP | 03-069248 | 7/1991 |
| 7,192,807 B1 | 3/2007 | Huemoeller et al. ......... 438/118 | JP | 03-177060 | 8/1991 |
| 7,242,081 B1 | 7/2007 | Lee | JP | 04-098864 | 3/1992 |
| 7,247,523 B1 | 7/2007 | Huemoeller et al. ......... 438/118 | JP | 05-129473 | 5/1993 |
| 7,272,444 B2 | 9/2007 | Peterson et al. ................ 607/30 | JP | 05-166992 | 7/1993 |
| 7,345,361 B2 | 3/2008 | Mallik et al. | JP | 05-283460 | 10/1993 |
| 7,372,151 B1 | 5/2008 | Fan et al. | JP | 06-092076 | 4/1994 |
| 2001/0008305 A1 | 7/2001 | McLellan et al. ............ 257/692 | JP | 06-140563 | 5/1994 |
| 2001/0011654 A1 | 8/2001 | Schmidt et al. .............. 219/746 | JP | 06-260532 | 9/1994 |
| 2001/0012704 A1 | 8/2001 | Eldridge | JP | 07-297344 | 11/1995 |
| 2001/0014538 A1 | 8/2001 | Kwan et al. .................. 438/690 | JP | 07-312405 | 11/1995 |
| 2002/0024122 A1 | 2/2002 | Jung et al. .................... 257/666 | JP | 08-064634 | 3/1996 |
| 2002/0027297 A1 | 3/2002 | Ikenaga et al. ............... 257/784 | JP | 08-083877 | 3/1996 |
| 2002/0061642 A1 | 5/2002 | Haji et al. .................... 438/613 | JP | 08-125066 | 5/1996 |
| 2002/0140066 A1 | 10/2002 | Lee ............................. 257/666 | JP | 08-222682 | 8/1996 |
| 2002/0140068 A1 | 10/2002 | Lee et al. ..................... 257/676 | JP | 08-306853 | 11/1996 |
| 2002/0163015 A1 | 11/2002 | Lee et al. ..................... 257/200 | JP | 09-008205 | 1/1997 |
| 2003/0013232 A1 | 1/2003 | Towle et al. ................. 438/113 | JP | 09-008206 | 1/1997 |
| 2003/0030131 A1 | 2/2003 | Lee et al. ..................... 257/666 | JP | 09-008207 | 1/1997 |
| 2003/0064548 A1 | 4/2003 | Isaak | JP | 09-092775 | 4/1997 |
| 2003/0073265 A1 | 4/2003 | Hu et al. ...................... 438/123 | JP | 09-293822 | 11/1997 |
| 2003/0134455 A1 | 7/2003 | Cheng et al. ................. 438/125 | JP | 10-022447 | 1/1998 |
| 2004/0004293 A1 | 1/2004 | Murayama ................... 257/780 | JP | 10-163401 | 6/1998 |
| 2004/0026781 A1 | 2/2004 | Nakai | JP | 10-199934 | 7/1998 |
| 2004/0046244 A1 | 3/2004 | Nakamura et al. | JP | 10-256240 | 9/1998 |
| 2004/0056277 A1 | 3/2004 | Karnezos ..................... 257/200 | JP | 2000-150765 | 5/2000 |
| 2004/0061212 A1 | 4/2004 | Karnezos ..................... 257/686 | JP | 2000-556398 | 10/2000 |
| 2004/0061213 A1 | 4/2004 | Karnezos ..................... 257/686 | JP | 2001-060648 | 3/2001 |
| 2004/0063242 A1 | 4/2004 | Karnezos ..................... 438/106 | JP | 2002-043497 | 2/2002 |
| 2004/0063246 A1 | 4/2004 | Karnezos ..................... 438/108 | KR | 1994-0001979 | 1/1994 |
| 2004/0113260 A1 | 6/2004 | Sunohara et al. ............ 257/698 | KR | 10-0220154 | 6/1999 |
| 2005/0242425 A1 | 11/2005 | Leal et al. .................... 257/690 | KR | 2002-0049944 | 6/2002 |
| 2005/0282314 A1 | 12/2005 | Lo et al. ...................... 438/117 | WO | WO 99/56316 | 11/1999 |
| 2007/0273049 A1 | 11/2007 | Khan et al. | WO | WO 99/67821 | 12/1999 |
| 2007/0290376 A1 | 12/2007 | Zhao et al. | | | |
| 2008/0230887 A1 | 9/2008 | Sun et al. | | | |

OTHER PUBLICATIONS

Huemoeller et al., U.S. Appl. No. 10/261,868, filed Oct. 1, 2002, entitled "Integrated Circuit Film Substrate Having Embedded Conductive Patterns and Vias".

Sheridan et al., U.S. Appl. No. 10/868,244, filed Jun. 15, 2004, entitled "Embedded Leadframe Semiconductor Package".

Huemoeller et al., U.S. Appl. No. 11/297,050, filed Dec. 7, 2005, entitled "Stacked Embedded Leadframe".

Huemoeller et al., U.S. Appl. No. 11/298,016, filed Dec. 8, 2005, entitled "Embedded Electronic Component Package".

Lee et al., U.S. Appl. No. 11/440,548, filed May 24, 2006, entitled "Substrate for Semiconductor Device and Manufacturing Method Thereof".

Huemoeller et al., U.S. Appl. No. 11/605,740, filed Nov. 28, 2006, entitled "Electronic Component Package Comprising Fan-Out and Fan-In Traces".

Huemoeller et al., U.S. Appl. No. 11/784,979, filed Apr. 9, 2007, entitled "Two-Sided Wafer Escape Package".

Huemoeller et al., U.S. Appl. No. 12/221,797, filed Aug. 5, 2008, entitled "Two-Sided Fan-Out Wafer Escape Package".

Huemoeller et al., "Embedded Electronic Component Package Fabrication Method", U.S. Appl. No. 12/459,532, filed Jul. 2, 2009.

FOREIGN PATENT DOCUMENTS

| | | |
|---|---|---|
| EP | 0 393 997 | 10/1990 |
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |

DIRECT-WRITE WAFER LEVEL CHIP SCALE PACKAGE

CROSS REFERENCE TO RELATED APPLICATION

This application is a continuation of U.S. patent application Ser. No. 11/289,826, filed on Nov. 29, 2005.

BACKGROUND OF THE INVENTION

1. Field of the Invention

The present invention relates to the field of integrated circuit packaging and, in particular, to wafer level chip scale packaging processes and structures.

2. Description of Related Art

In the prior art, wafer level chip scale packaging techniques typically involved adding various layers to integrated circuit wafers and then patterning the layers using a complex series of masking and photo etching steps. Typically, additive layers were spun-on, sprayed-on as a vapor, or printed on the integrated circuit wafers. As noted above, prior art techniques also typically required the use of photoimageable materials such as Cyclotone™ products or polyimides and the use of extensive photo-definition processes, i.e., masking and photo-etching of the layers.

In the prior art, many of the coatings or layers discussed above, such as photoresist, were not permanent, and did not remain part of the finished product. Rather, many layers were used as temporary masks and were later removed. Consequently, the prior art techniques required multiple steps and significant amounts of discarded/wasted materials. In addition, the process of depositing the prior art layers described above, and then subsequently photo-patterning and photo-etching the layers, was inherently expensive and labor intensive as well as time consuming and complicated.

In addition, the prior art photoimagable materials had to be of specific and limited thickness for the prior art processes to work, and be practical. In the prior art, these thicknesses were typically limited to less than twenty (20) microns. Consequently, the resulting structures typically offered limited flexibility and opportunity for "compliance" between interconnections, and the surfaces of the dies comprising the integrated circuit wafers.

What is needed is a wafer level chip scale packaging method and structure that is not dependent on photolithography and therefore eliminates the need for photoimagable materials, non-permanent layers and the wasteful photo-definition process and makes feasible structures that would be impractical using prior art methods.

SUMMARY OF THE INVENTION

A method and structure according to one embodiment of the invention provides a Direct Write Wafer Level Chip Scale Package (DWWLCSP) that utilizes permanent layers/coatings and direct write techniques to pattern these layers/coatings.

According to one embodiment of the invention, a Direct Write Wafer Level Chip Scale Package is created by first preparing a silicon wafer and then a dielectric layer is attached directly to the wafer. In one embodiment of the invention, the dielectric layer is a layer of InterVia® 8000 or a similar material. The dielectric layer is then ablated to form vias and trench patterns. The surface of the dielectric layer is then plated with a conductive layer, such as copper, or another suitable metal, to fill in all of the related via and trench patterns and thereby form conductive patterns and connections to the die pads. According to one embodiment of the invention, the conductive layer is then partially removed through a controlled etching process, leaving only the conductor patterns and connections to the die pads. In one embodiment of the invention, these patterns are then processed through standard solder application techniques such as solder masking and/or other solder application methods known in the art.

In one embodiment of the invention, the dielectric layer is ablated in such a way as to form patterned vias to the die pads. The vias can be patterned in any way that the user of the invention deems necessary. For instance, in one embodiment of the invention, rather than simply ablating a single cylindrical or rectangular via to the die pads, a pattern of multiple smaller cylindrical or rectangular vias are formed. This particular structure provides a cushion of dielectric material between sub-vias for thermal expansion and therefore provides better compliance properties between solder bumps, or other interconnections, and the surfaces of the dies comprising the silicon wafers.

According to another embodiment of the invention, a Direct Write Wafer Level Chip Scale Package is created by first preparing a silicon wafer and then a dielectric layer is attached to the wafer using an adhesive layer. The dielectric layer is then ablated to form via and trench patterns. The surface of the dielectric layer is then plated with a conductive layer, such as copper or another suitable conductive material, to fill in all of via and trench patterns and thereby form conductor patterns and connections to the die pads. According to one embodiment of the invention, the conductive layer is then partially removed through a controlled etching process, leaving only the conductor patterns and connections to the die pads. In one embodiment of the invention, these patterns are then processed through any standard solder application techniques, such as solder masking and/or other solder application methods known in the art.

According to one embodiment of the invention, because of the flexible thicknesses of the dielectric available using the methods and structures of the invention, the dielectric and conductive layers of the invention can be laminated, which enables the creation of multilayer Direct Write Wafer Level Chip Scale Package structures at lower costs, and with improved reliability of the finished Direct Write Wafer Level Chip Scale Packaged electronic component.

As noted above, the Direct Write Wafer Level Chip Scale Packages of the invention include dielectric and conductive materials applied directly onto the wafer surface. The dielectric layers are then ablated, as opposed to imaged using photolithography. Consequently, using the method and structure of the present invention, the materials used need not be photoimagable materials, thus saving the cost of the materials themselves and the cost of indirect materials required for the masking and etching steps.

In addition, using the methods and structures of the present invention, the dielectric layers can be attached to the wafer with an adhesive layer and this adhesive layer need not be patterned using standard techniques. In addition, according to the method and structure of the invention, the conductive layer building process is solely additive, using the ablated dielectric layer as its mask. Consequently, the need for subsequent patterning and etching is eliminated.

In, addition, since using the method and structure of the present invention, the materials used need not be photoimagable materials, the materials need not be of the prior art specified limited thickness. Consequently, the resulting structures of the invention provide the opportunity for greater flexibility and "compliance" between solder bumps, or other interconnections, and the surfaces of the dies comprising the silicon wafers.

In addition, as discussed above, according to one embodiment of the invention, the dielectric layer is ablated in such a way as to form patterned vias to the die pads. The vias can be patterned in any way that the user of the invention deems necessary. For instance, in one embodiment of the invention, rather than simply ablating a single cylindrical or rectangular via to the die pads, a pattern of multiple smaller cylindrical or rectangular vias are formed. This particular structure provides a cushion of dielectric material between sub-vias for thermal expansion and therefore provides better compliance properties.

BRIEF DESCRIPTION OF THE DRAWINGS

Common reference numerals are used throughout the drawings and detailed description to indicate like elements.

DETAILED DESCRIPTION

Figure 1A:
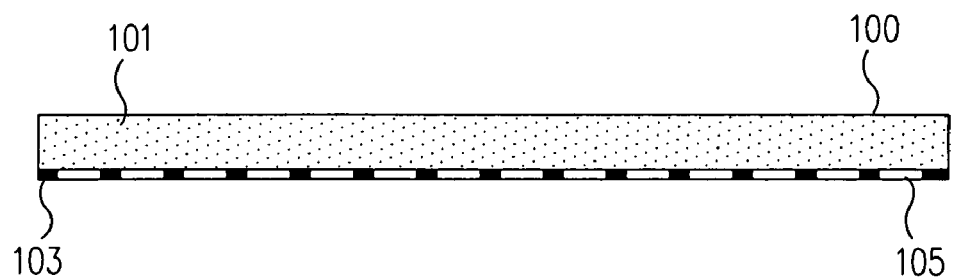
FIG. 1A shows a silicon wafer, including one or more electronic components such as integrated circuits.

A method and structure according to one embodiment of the invention provides a Direct Write Wafer Level Chip Scale Package (DWWLCSP) that utilizes permanent coatings/layers and direct write techniques to pattern these coatings/layers.

According to one embodiment of the invention, a Direct Write Wafer Level Chip Scale Package (121 in FIG. 1H) is created by first preparing a silicon wafer (100 in FIG. 1A) and then a dielectric layer, also called a first dielectric layer, (107 in FIG. 1B) is attached directly to the wafer. The dielectric layer is then ablated to form vias and trench patterns (104 in FIG. 1C). In one embodiment of the invention, the dielectric layer 407 in FIG. 4B) is ablated in such a way as to form patterned vias (411 in FIG. 4B) to the die pads 498 in FIG. 4B). The vias can be patterned in any way that the user of the invention deems necessary. For instance, in one embodiment of the invention, rather than simply ablating a single cylindrical or rectangular via to the die pads, a pattern of multiple smaller cylindrical or rectangular sub-vias (416A, 416B, 416C in FIG. 4A) are formed. This particular structure provides a cushion of dielectric material (407A and 407B) between sub-vias for thermal expansion and therefore provides better compliance properties between solder bumps, or other interconnections, and the surfaces of the dies comprising the silicon wafers. The surface of the dielectric layer is then plated with a conductive layer, also called a first conductive layer, (111 in FIG. 1D), such as copper, or another suitable metal, to fill in all of related via and trench patterns and thereby form conductor patterns and connections to the die pads (FIG. 1D). According to one embodiment of the invention, the conductive layer is then partially removed through a controlled etching process, leaving only the conductor patterns and connections to the die pads (FIG. 1E). In one embodiment of the invention, these patterns are then processed through standard solder application techniques (FIG. 1F).

Figure 2A:
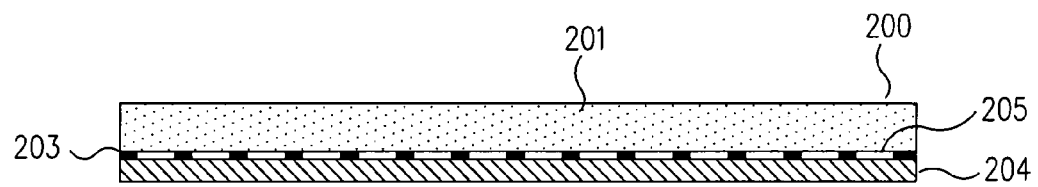
FIG. 2A shows a silicon wafer, including an adhesive layer applied in to the silicon wafer in accordance with the principles of one embodiment of the present invention.
Figure 2B:
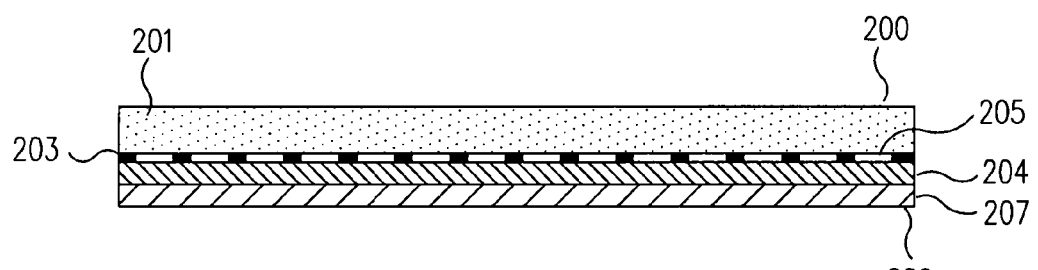
FIG. 2B shows the structure of FIG. 2A, including a dielectric layer applied to the silicon wafer using the adhesive layer of FIG. 2A in accordance with the principles of one embodiment of the present invention.
Figure 2C:
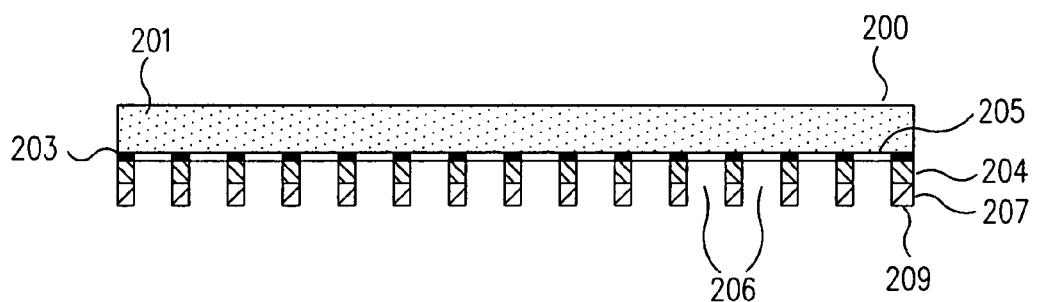
FIG. 2C shows the structure of FIG. 2B after the dielectric layer has been ablated to form vias and trenches in accordance with the principles of one embodiment of the present invention.
Figure 2D:
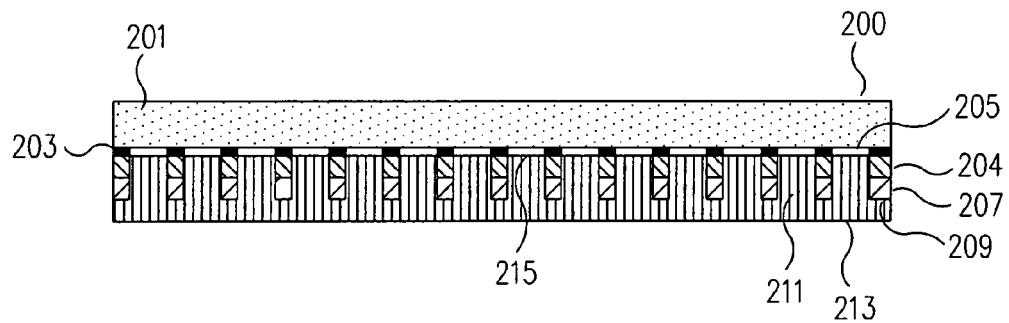
FIG. 2D shows a layer of conductive material applied to the structure of FIG. 2C in accordance with the principles of one embodiment of the present invention.
Figure 2E:
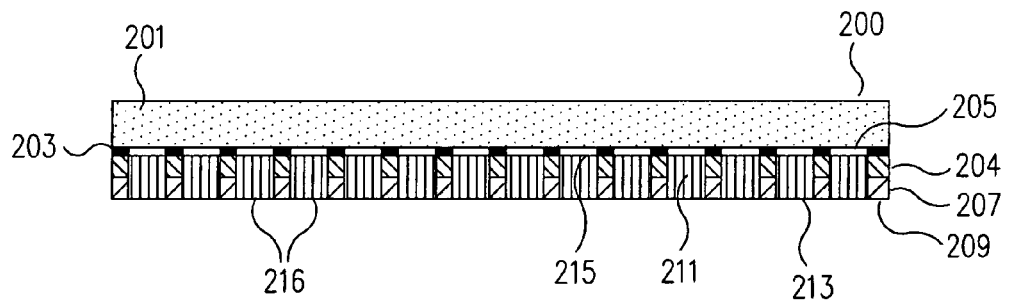
FIG. 2E shows the structure of FIG. 2D after the layer of conductive material is etched using a controlled etching process in accordance with the principles of one embodiment of the present invention.
Figure 2F:
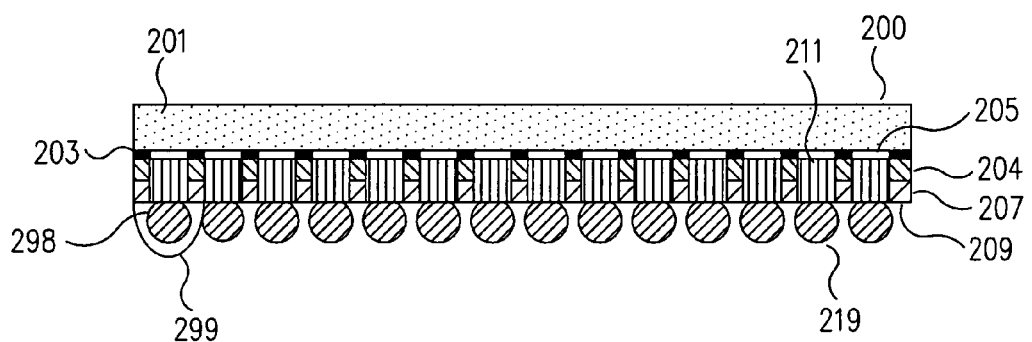
FIG. 2F shows the structure of FIG. 2E with solder bumps attached to points on the conductive layer in accordance with the principles of one embodiment of the present invention.

According to another embodiment of the invention, a Direct Write Wafer Level Chip Scale Package (221 in FIG. 2H) is created by first preparing a silicon wafer (200 in FIG. 2A) and then a dielectric layer, also called a first dielectric layer, (207 in FIG. 2B) is attached to the wafer using an adhesive (204 in FIG. 2B). The dielectric layer is then ablated to form via and trench patterns (FIG. 2C). In one embodiment of the invention, the dielectric layer is ablated in such a way as to form patterned vias to the die pads. The vias can be patterned in any way that the user of the invention deems necessary. For instance, in one embodiment of the invention, rather than simply ablating a single cylindrical or rectangular via to the die pads, a pattern of multiple smaller cylindrical or rectangular vias are formed. As discussed above, this particular structure provides for thermal expansion and therefore provides better compliance properties between solder bumps, or other interconnections, and the surfaces of the dies comprising the silicon wafers. The surface of the dielectric layer is then plated with a conductive layer, also called a first conductive layer, (211 in FIG. 2D), such as copper or another suitable conductive material, to fill in all of via and trench patterns and thereby form conductor patterns and connections to the die pads (FIG. 2D). According to one embodiment of the invention, the conductive layer is then partially removed through a controlled etching process, leaving only the conductor patterns and connections to the die pads (FIG. 2E). In one embodiment of the invention, these patterns are then processed through any standard solder application techniques (FIG. 2F).

According to one embodiment of the invention, because of the flexible thicknesses available using the methods and structures of the invention, the dielectric and conductive layers of the invention can be laminated (FIGS. 3A to 3M), which enables the creation of multilayer Direct Write Wafer Level Chip Scale Package structures (FIG. 3M) at lower costs, and with improved reliability of the finished Direct Write Wafer Level Chip Scale Package.

As noted above, the Direct Write Wafer Level Chip Scale Packages of the invention include dielectric and conductive materials applied directly onto the wafer surface. The dielectric layers are then ablated, as opposed to imaged using photolithography. Consequently, using the method and structure of the present invention. The materials used need not be photoimagable materials, thus saving the cost of the materials themselves and the cost of the masking and etching steps.

In addition, using the methods and structures of the present invention, the dielectric layers can be attached to the wafer with an adhesive layer and this adhesive layer need not be patterned using standard techniques. In addition, according to the method and structure of the invention, the conductive layer building process is solely additive using the ablated dielectric layer as its mask. Consequently, the need for subsequent patterning and etching is eliminated.

In, addition, since using the method and structure of the present invention, the materials used need not be photoimagable materials, the materials need not be of the prior art predetermined and specified thicknesses. Consequently, the resulting structures of the invention provide the opportunity for greater flexibility and "compliance" between solder bumps, or other interconnections, and the surfaces of the dies comprising the silicon wafers. In addition, since using the method and structure of the present invention, the materials used need not be photoimagable materials, any one of numerous known adhesives and intermediate layer materials can be used with the method and structure of the invention.

In particular, FIG. 1A shows a silicon wafer 100 that has been prepared for the packaging process and includes bonding locations, or pads, 105. As shown in FIG. 1A, silicon wafer 100 has a silicon wafer first surface 101 and a silicon wafer second surface 103. Silicon wafers are well known to those of skill in the art and typically include one or more electronic components, such as integrated circuits, (not shown) formed in, or on, silicon wafer 100 by methods well known to those of skill in the art.

Figure 1B:
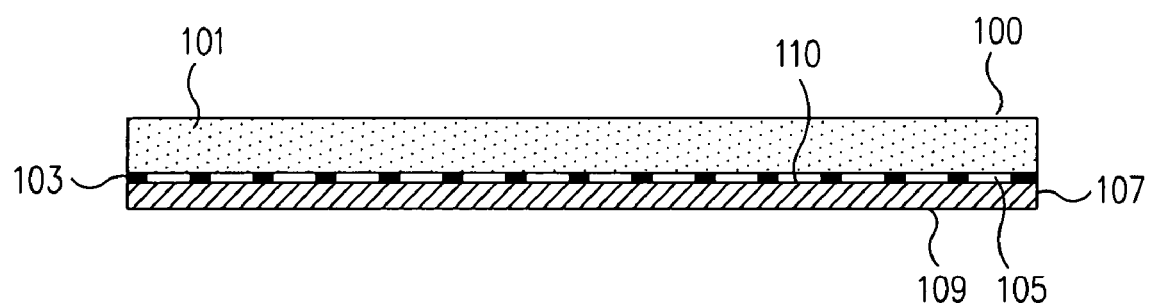
FIG. 1B shows the silicon wafer of FIG. 1A, including a dielectric layer applied to the silicon wafer in accordance with the principles of one embodiment of the present invention.

Once silicon wafer 100 is prepared, according to a first embodiment of the invention, a dielectric layer 107 is applied directly to silicon wafer second surface 103 of silicon wafer 100. FIG. 1B shows silicon wafer 100 of FIG. 1A including a dielectric layer, also called a first dielectric layer, 107 applied directly to silicon wafer second surface 103 of silicon wafer 100 in accordance with the principles of one embodiment of the present invention. As shown in FIG. 1B, a dielectric layer first surface 110 of dielectric layer 107 is applied directly to silicon wafer second surface 103 of silicon wafer 100.

According to the principles of one embodiment of the present invention, dielectric layer 107 is a polymer layer. In one embodiment of the invention, dielectric layer 107 is made of InterVia® 8000 material and has a thickness of approximately forty (40) microns. However, those of skill in the art will readily recognize, in light of this disclosure, that many different types of materials and thicknesses can be used for dielectric layer 107.

Figure 1C:
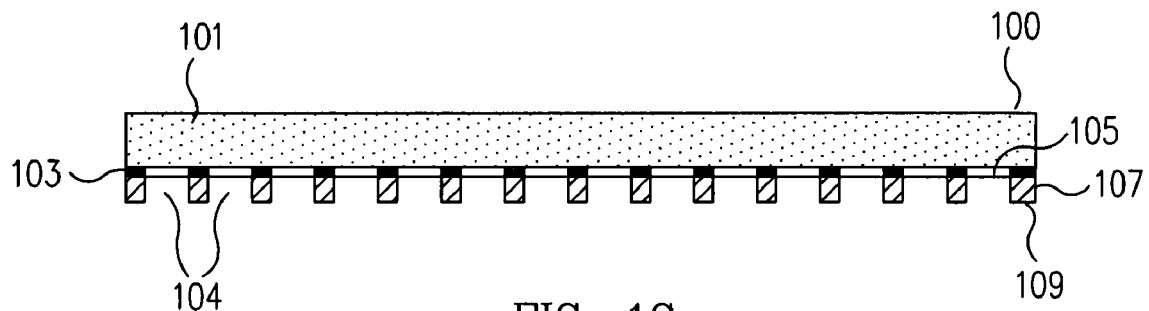
FIG. 1C shows the silicon wafer of FIG. 1B after the dielectric layer has been ablated to form vias and trenches in accordance with the principles of one embodiment of the present invention.
Figure 1D:
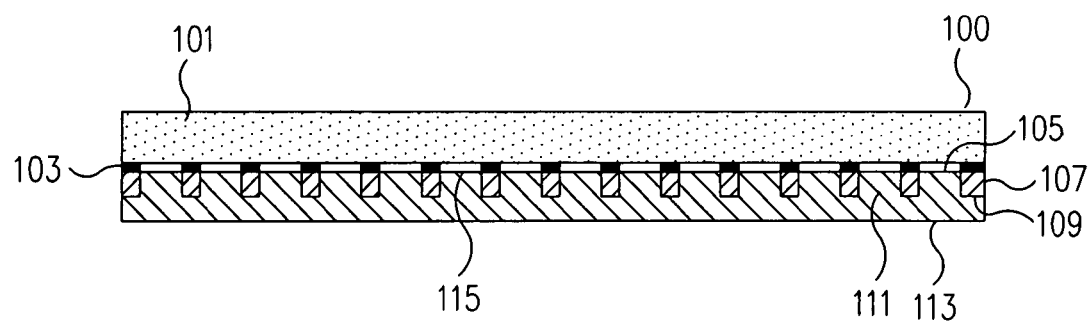
FIG. 1D shows a layer of conductive material applied to the structure of FIG. 1C in accordance with the principles of one embodiment of the present invention.
Figure 1E:
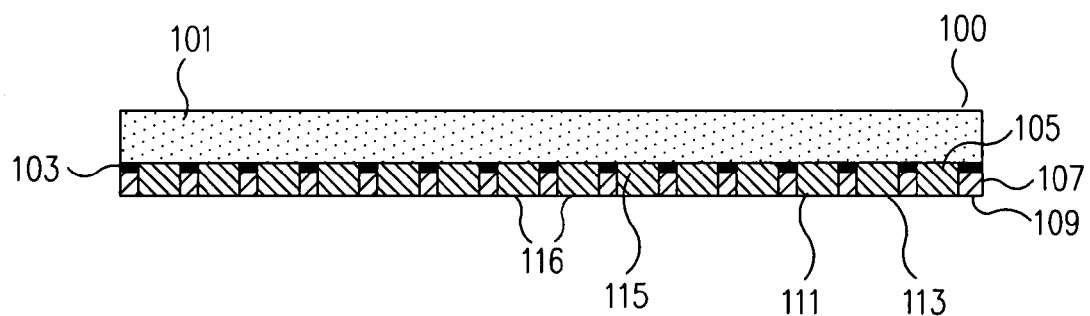
FIG. 1E shows the structure of FIG. 1D after the layer of conductive material is etched using a controlled etching process in accordance with the principles of one embodiment of the present invention.
Figure 1F:
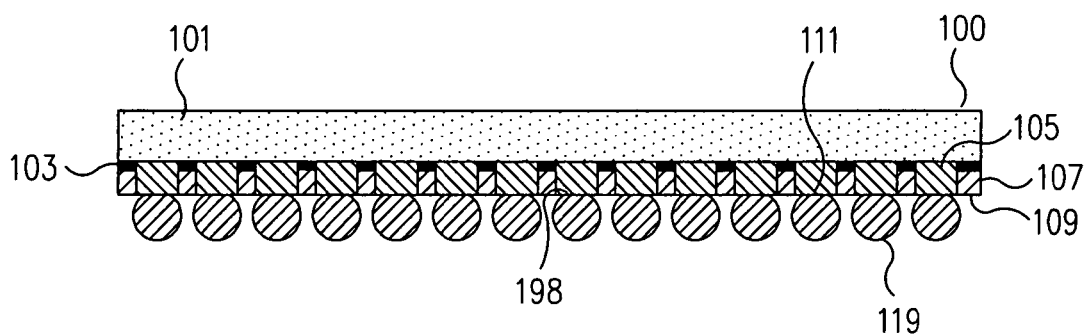
FIG. 1F shows the structure of FIG. 1E with solder bumps attached to points on the conductive layer in accordance with the principles of one embodiment of the present invention.

According to the principles of the invention, dielectric layer 107 is then ablated, using a laser or other ablation means, to form various predetermined patterns 104 in dielectric layer 107. FIG. 1C shows the structure of FIG. 1B after dielectric layer 107 has been ablated to form vias and trenches 104 in accordance with the principles of one embodiment of the present invention. As discussed in more detail below with respect to FIGS. 4A and 4B, in one embodiment of the invention, dielectric layer 107 is ablated in such a way as to form patterned vias to the die pads. The vias can be patterned in any way that the user of the invention deems necessary. For instance, in one embodiment of the invention, rather than simply ablating a single cylindrical or rectangular via to the die pads, a pattern or multiple smaller cylindrical or rectangular vias are formed. As discussed in more detail below, this particular structure provides for thermal expansion and therefore provides better compliance properties between solder bumps, or other interconnections, and the surfaces of the dies comprising the silicon wafers.

As noted above, in one embodiment of the invention, the Direct Write Wafer Level Chip Scale Packages of the invention include dielectric layer 107 laminated directly onto the silicon wafer second surface 103 and the dielectric layer 107 is then ablated, as opposed to imaged using the photolithography techniques of the prior art. Consequently, using the method and structure of the present invention, the materials used need not be photoimagable materials.

As shown in FIG. 1D, according to the principles of the invention, a conductive layer, also called a first conductive layer, 111 is then applied to silicon wafer second surface 103 and dielectric layer second surface 109. In one embodiment of the invention conductive layer 111 is copper, or another suitable metal, and is applied to an approximate thickness of approximately five (5) microns above dielectric layer second surface 109.

According to the principles of one embodiment of the invention, conductive layer 111 includes a conductive layer first surface 115 that is in electrical contact with bonding locations 105 and a conductive layer second surface 113. According to the principles of one embodiment of the invention, conductive layer 111 is then etched away in a controlled etch process that results in conductive layer second surface 113 being made level with dielectric layer second surface 109. By this process electrically conductive traces and vias 116 are formed As discussed in more detail below with respect to FIG. 4B, using controlled etching, and the methods of the present invention, portions of conductive layer second surface 113, such as bonding points 198 for solder balls and other interconnections, can, in one embodiment of the invention, be left higher that dielectric layer second surface 109 to facilitate better bonding and compliance.

FIG. 1E shows the structure of FIG. 1D after conductive layer 111 is etched using the controlled etching process in accordance with the principles of one embodiment of the present invention. Depth controlled etching processes such as that used to bring conductive layer second surface 113 level with, or with potions slightly raised above, dielectric layer second surface 109 are well known to those of skill in the art and are therefore not discussed in further detail herein to avoid detracting from the present invention.

As shown above, according to the method and structure of the invention, the conductive layer 111 building process is solely additive using the ablated dielectric layer 107 as a mask. Consequently, the need for subsequent masks, patterning, and etching, as required in the prior art, is eliminated.

Since using the method and structure of the present invention, the materials used for dielectric layer 107 need not be photoimagable materials, the materials need not be of the prior art predetermined and specific thicknesses. Consequently, the resulting structures of the invention provide the opportunity for greater flexibility and "compliance" between solder bumps, or other interconnections, and the surfaces of the dies comprising the integrated circuit wafers.

FIG. 1F shows the structure of FIG. 1E with solder bumps 119 attached to selected bonding points 198 on conductive layer 111 using standard bumping techniques in accordance with the principles of one embodiment of the present invention.

Figure 1G:
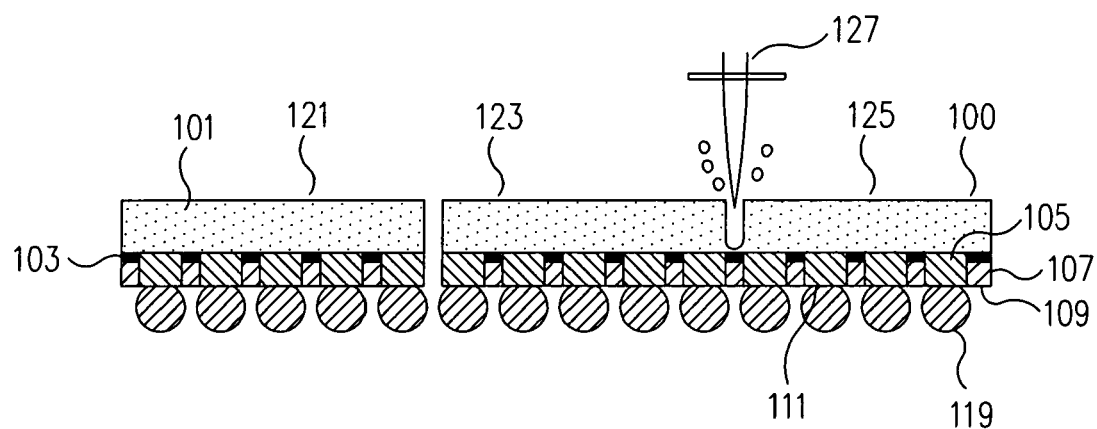
FIG. 1G shows the structure of FIG. 1F being singulated into individual Direct Write Wafer Level Chip Scale Packaged electronic components, in accordance with the principles of one embodiment of the present invention.

FIG. 1G shows the structure of FIG. 1F being singulated into individual Direct Write Wafer Level Chip Scale Packaged electronic components 121, 123 and 125 using a standard cutting means 127 such as a saw.

Figure 1H:
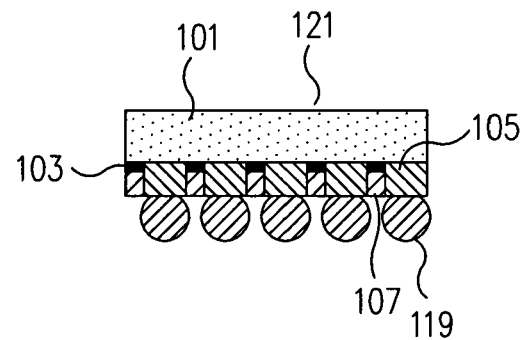
FIG. 1H shows a singulated Direct Write Wafer Level Chip Scale Package in accordance with the principles of one embodiment of the present invention.

FIG. 1H shows a singulated Direct Write Wafer Level Chip Scale Packaged electronic component 121 in accordance with the principles of one embodiment of the present invention.

Referring to FIG. 2A, according to one embodiment of the invention, a silicon wafer 200 is first prepared for the packaging process, as discussed above. In this embodiment of the invention silicon wafer 200 includes a silicon wafer first surface 201, a silicon wafer second surface 203, and bonding locations, or pads, 205. In addition, an adhesive layer 204 is applied to silicon wafer second surface 203 using methods well known to those of skill in the art such as spinning or spraying.

FIG. 2B shows the structure of FIG. 2A, including a dielectric layer, also called a first dielectric layer, 207 applied to silicon wafer second surface 203 using adhesive layer 204 of FIG. 2A. According to the principles of the invention, dielectric layer 207 is then ablated, using a laser or other ablation means, to form various predetermined patterns 206 in dielectric layer 207. As discussed in more detail below with respect to FIGS. 4A and 4B, in one embodiment of the invention, dielectric layer 207 is ablated in such a way as to form patterned vias to the die pads. The vias can be patterned in any way that the user of the invention deems necessary. For instance, in one embodiment of the invention, rather than simply ablating a single cylindrical or rectangular via to the die pads, a pattern of multiple smaller cylindrical or rectangular vias are formed. As discussed below, this particular structure provides for thermal expansion and therefore provides better compliance properties between solder bumps, or other interconnections, and the surfaces of the dies comprising the silicon wafers. FIG. 2C shows silicon wafer 200 of FIG. 2B after dielectric layer 207 and adhesive layer 204 have been ablated to form vias and trenches 206 in accordance with the principles of one embodiment of the present invention.

As noted above, the Direct Write Wafer Level Chip Scale Packages of the invention include dielectric layer 207 applied onto the silicon wafer second surface 203 and dielectric layer 207 is then ablated, as opposed to imaged using the photolithography techniques of the prior art. Consequently, using the method and structure of the present invention, the materials used need not be photoimagable materials.

As shown in FIG. 2D, according to the principles of the invention, a conductive layer, also called a first conductive layer, 211 is then applied to silicon wafer second surface 203 and dielectric layer second surface 209. In one embodiment of the invention conductive layer 211 is copper, or another suitable metal, and is applied to an approximate thickness of five (5) microns above dielectric layer second surface 209.

According to the principles of one embodiment of the invention, conductive layer 211 includes a conductive layer first surface 215 that is in electrical contact with bonding locations 205 and a conductive layer second surface 213.

According to the principles of one embodiment of the invention, conductive layer 211 is then etched away in a controlled etch process that results in conductive layer second surface 213 being made level with dielectric layer second surface 209. In this way electrically conductive traces and vias 216 are formed. As discussed in more detail below with respect to FIG. 4B, using controlled etching, and the methods of the present invention, portions of conductive layer second surface 213, such as bonding locations for solder balls and other interconnections, can, in one embodiment of the invention, be left higher than dielectric layer second surface 209 to facilitate better bonding and compliance.

FIG. 2E shows the structure of FIG. 2D after conductive layer 211 is etched using the controlled etching process in accordance with the principles of one embodiment of the present invention. Depth controlled etching processes such as that used to bring conductive layer second surface 213 level with, or with selected portions raised above, dielectric layer second surface 209 are well known to those of skill in the art and are therefore not discussed in further detail herein to avoid detracting from the present invention.

As shown above, according to the method and structure of the invention, the conductive layer 211 building process is solely additive using the ablated dielectric layer 207 as a mask. Consequently, the need for subsequent masks, patterning, and etching, as required in the prior art, is eliminated.

Since using the method and structure of the present invention the materials used for dielectric layer 207 need not be photoimagable materials, the materials need not be of the prior art predetermined and specific thicknesses. Consequently, the resulting structures of the invention provide the opportunity for greater flexibility and "compliance" between solder bumps, or other interconnections, and the surfaces of the dies comprising the integrated circuit wafers.

FIG. 2F shows the structure of FIG. 2E with solder bumps 219 attached to selected bonding points 298 on conductive layer 211 using standard bumping techniques in accordance with the principles of one embodiment of the present invention.

Figure 2G:
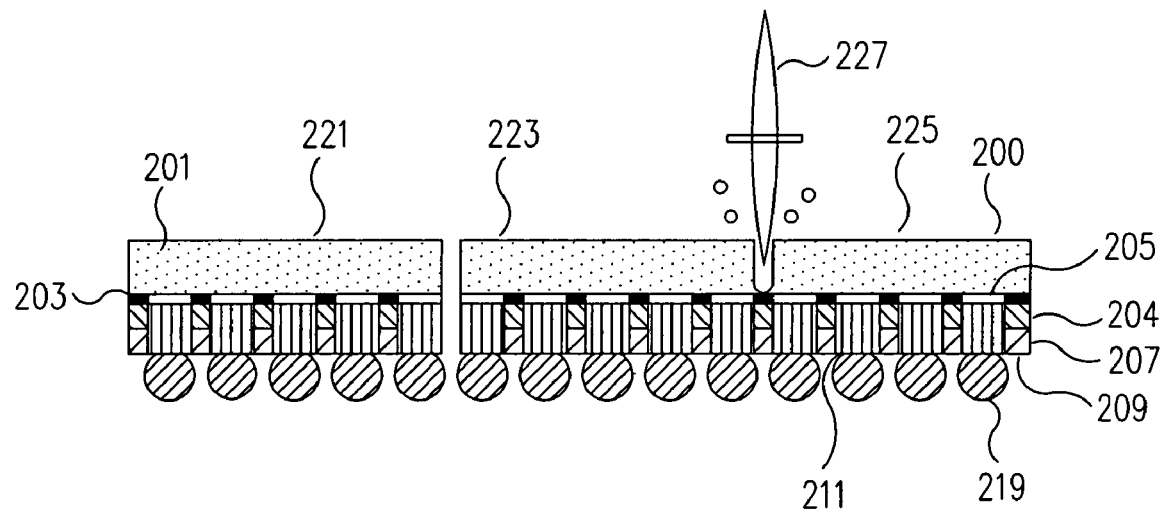
FIG. 2G shows the structure of FIG. 2F being singulated into individual Direct Write Wafer Level Chip Scale Packaged electronic components, in accordance with the principles of one embodiment of the present invention.

FIG. 2G shows the structure of FIG. 2F being singulated into individual Direct Write Wafer Level Chip Scale Packaged electronic components 221, 223 and 225 using a standard cutting means 227 such as a saw.

Figure 2H:
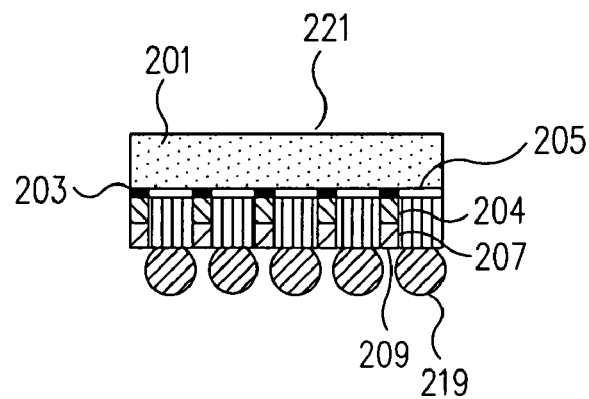
FIG. 2H shows a singulated Direct Write Wafer Level Chip Scale Packaged electronic component in accordance with the principles of one embodiment of the present invention.

FIG. 2H shows a singulated Direct Write Wafer Level Chip Scale Packaged electronic component 221 in accordance with the principles of one embodiment of the present invention.

Using the methods and structure of the present invention the permanent layers of the invention, i.e., the dielectric and conductive layers 107, 207 and 111, 211 respectively can be laminated or glued, which enables the creation of multilayer Direct Write Wafer Level Chip Scale Packaged electronic components at lower costs, and with improved reliability of the finished package.

FIGS. 3A to 3M show the process and structure for a multilayer Direct Write Wafer Level Chip Scale Package in which a first dielectric layer is attached using an adhesive layer, such as discussed above with respect to FIGS. 2A to 2H, and a second dielectric layer is directly attached, such as discussed above with respect to FIGS. 1A to 1H.

Figure 3A:
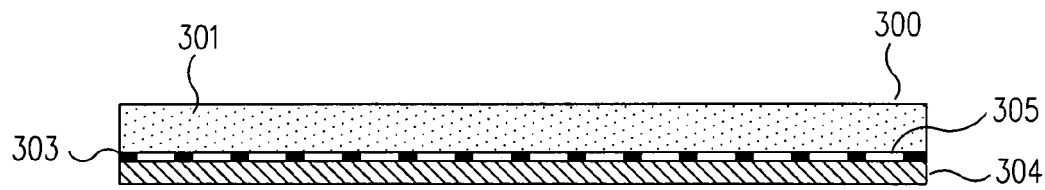
FIG. 3A shows the silicon wafer, including an adhesive layer applied in to the silicon wafer in accordance with the principles of one embodiment of the present invention.

Referring to FIG. 3A, according to one embodiment of the invention, a silicon wafer 300 is first prepared for the packaging process, as discussed above. In this embodiment of the invention, silicon wafer 300 includes a silicon wafer first surface 301, a silicon wafer second surface 303, and bonding locations or pads 305. In addition, an adhesive layer 304 is applied to silicon wafer second surface 303 using methods well known to those of skill in the art such as spinning or spraying.

Figure 3B:
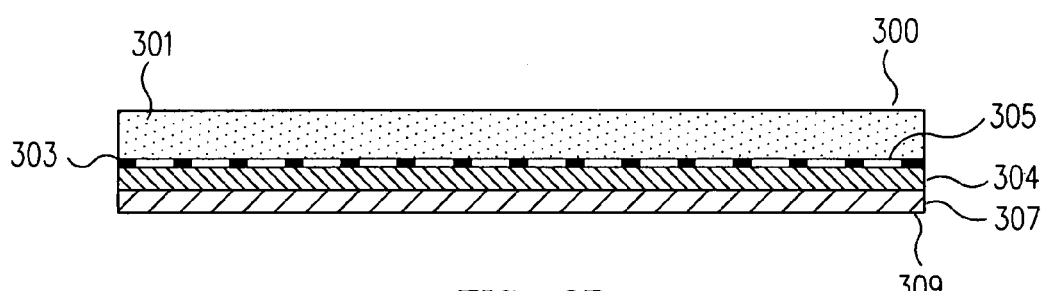
FIG. 3B shows the structure of FIG. 3A, including a dielectric layer applied to the silicon wafer using the adhesive layer of FIG. 3A in accordance with the principles of one embodiment of the present invention.

FIG. 3B shows the structure of FIG. 3A, including a first dielectric layer 307 applied to silicon wafer second surface 303 using adhesive layer 304 of FIG. 3A.

Figure 3C:
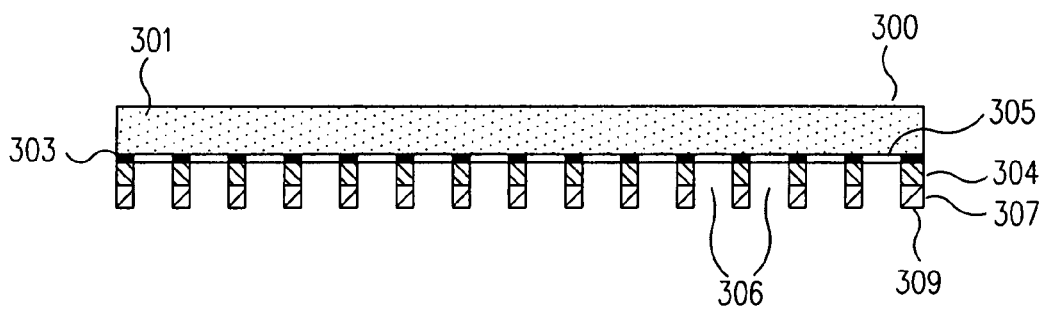
FIG. 3C shows the structure of FIG. 3B after the dielectric layer has been ablated to form vias and trenches in accordance with the principles of one embodiment of the present invention.

According to the principles of the invention, first dielectric layer 307 is then ablated, using a laser or other ablation means, to form various predetermined patterns 306 in first dielectric layer 307. FIG. 3C shows silicon wafer 300 of FIG. 3B after first dielectric layer 307 has been ablated to form vias and trenches 306 in accordance with the principles of one embodiment of the present invention.

As noted above, one embodiment of the multilayer Direct Write Wafer Level Chip Scale Packages of the invention includes first dielectric layer 307 laminated directly onto the silicon wafer second surface 303 and first dielectric layer 307 is then ablated, as opposed to imaged using the photolithography techniques of the prior art. Consequently, using the method and structure of the present invention, the materials used need not be photoimagable materials.

Figure 3D:
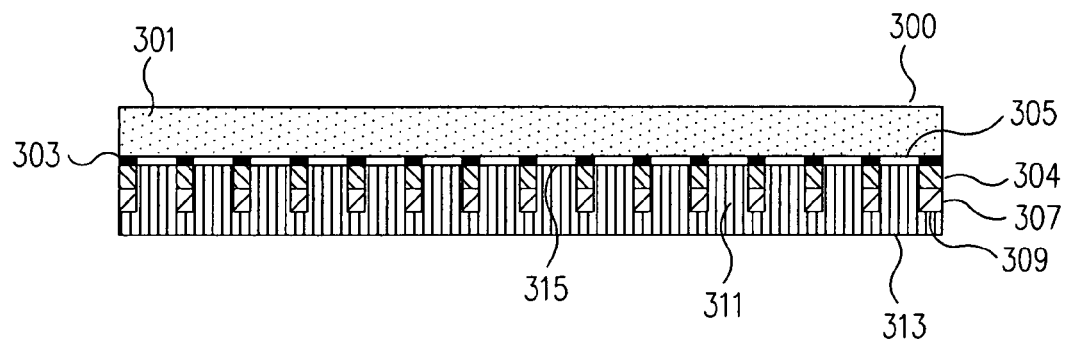
FIG. 3D shows a layer of conductive material applied to the structure of FIG. 3C in accordance with the principles of one embodiment of the present invention.

As shown in FIG. 3D, according to the principles of the invention, a first layer of conductive material 311 is then applied to silicon wafer second surface 303 and first dielectric layer second surface 309 of first dielectric layer 307. In one embodiment of the invention first conductive layer 311 is copper, or another suitable metal, and is applied to an approximate thickness of five (5) microns above first dielectric layer second surface 309 of first dielectric layer 307.

Figure 3E:
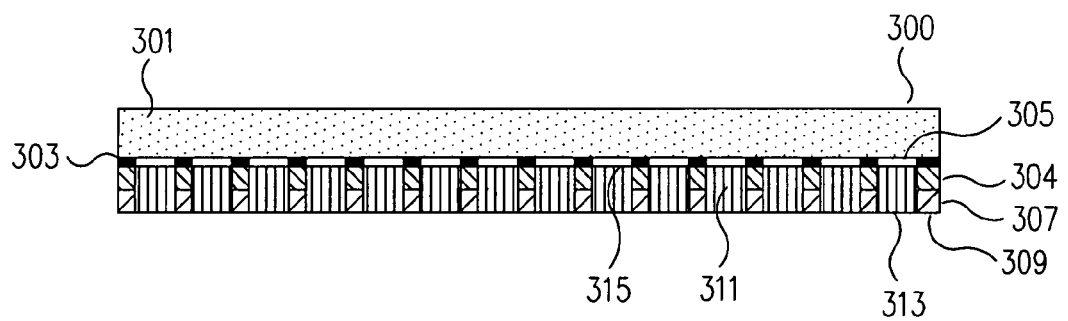
FIG. 3E shows the structure of FIG. 3D after the layer of conductive material is etched using a controlled etching process in accordance with the principles of one embodiment of the present invention.

According to the principles of one embodiment of the invention, first conductive layer 311 includes a first conductive layer first surface 315 that is in electrical contact with bonding locations 305 and a first conductive layer second surface 313. According to the principles of one embodiment of the invention, first conductive layer 311 is then etched away in a controlled etch process that results in first conductive layer second surface 313 of first conductive layer 311 being made level with first dielectric layer second surface 309 of first dielectric layer 307. FIG. 3E shows the structure of FIG. 3D after first conductive layer 311 is etched using the controlled etching process in accordance with the principles of one embodiment of the present invention. Depth controlled etching processes can be used to bring first conductive layer second surface 313 of first conductive layer 311 level with first dielectric layer second surface 309 of first dielectric layer 307 as well known to those of skill in the art and are therefore not discussed in further detail herein to avoid detracting from the present invention.

As shown above, according to the method and structure of the invention, the conductive layer 311 building process is solely additive using the ablated first dielectric layer 307 as its mask. Consequently, the need for subsequent masks, patterning, and etching, as required in the prior art, is eliminated using the present invention.

Figure 3F:
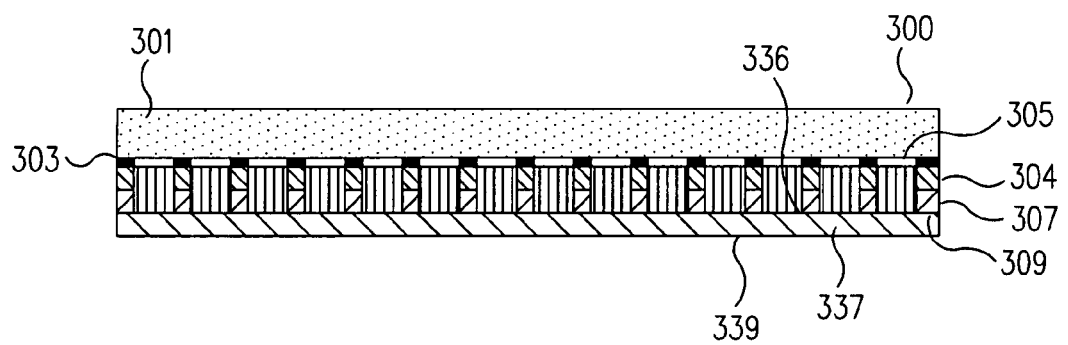
FIG. 3F shows the structure of FIG. 3E, including a second dielectric layer applied in accordance with the principles of one embodiment of the present invention.

According to this embodiment of the invention a second dielectric layer is now applied to the structure of FIG. 3E. FIG. 3F shows the structure of FIG. 3E including a second dielectric layer 337. As shown in FIG. 3F, a second dielectric layer first surface 336 of second dielectric layer 337 is applied directly to first dielectric layer second surface 309 of first dielectric layer 307 and first conductive layer second surface 313 of first conductive layer 311 in accordance with the principles of one embodiment of the present invention. According to the principles of one embodiment of the present invention, second dielectric layer 337 is a polymer layer of InterVia® 8000, or a similar material having a thickness of forty (40) microns. However, those of skill in the art will readily recognize, in light of this disclosure, that many different types of materials and thicknesses can be used for second dielectric layer 337.

Figure 3G:
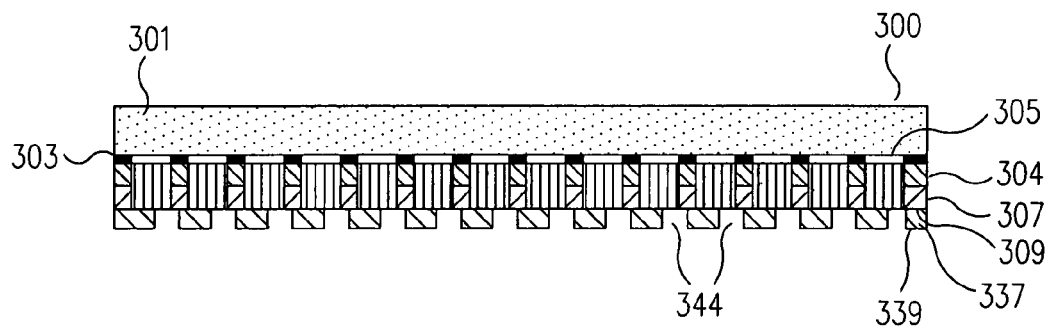
FIG. 3G shows the structure of FIG. 3F after the second dielectric layer has been ablated to form vias and trenches in accordance with the principles of one embodiment of the present invention.

According to the principles of the invention, second dielectric layer 337 is then ablated, using a laser or other ablation means, to form various predetermined patterns 344 in dielectric layer 337. As discussed in more detail below with respect to FIGS. 4A and 4B, in one embodiment of the invention, dielectric layer 337 is ablated in such a way as to form patterned vias to the die pads. The vias can be patterned in any way that the user of the invention deems necessary. For instance, in one embodiment of the invention, rather than simply ablating a single cylindrical or rectangular via to the die pads, a pattern of multiple smaller cylindrical or rectangular vias are formed. As discussed in more detail below, this particular structure provides for thermal expansion and therefore provides better compliance properties between solder bumps, or other interconnections, and the surfaces of the dies comprising the silicon wafers. FIG. 3G shows the structure of FIG. 3F after second dielectric layer 337 has been ablated to form vias and trenches 344 in accordance with the principles of one embodiment of the present invention.

Figure 3H:
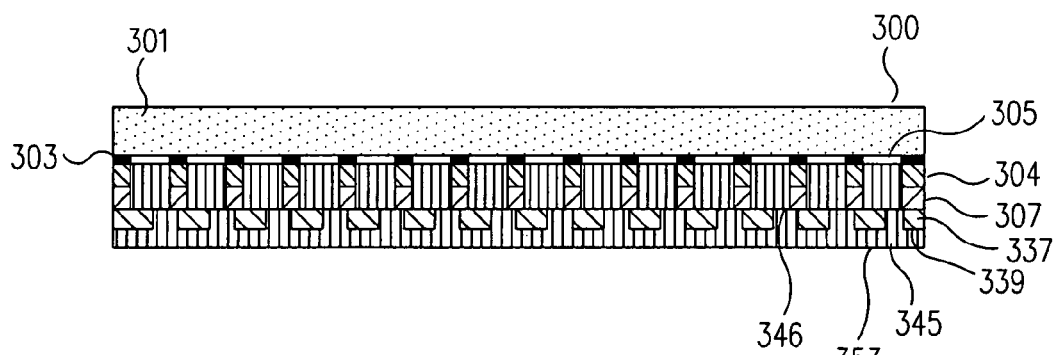
FIG. 3H shows a second layer of conductive material applied to the structure of FIG. 3G in accordance with the principles of one embodiment of the present invention.

As shown in FIG. 3H, according to the principles of the invention, a second conductive layer 345 is then applied to second dielectric layer second surface 339 of second dielectric layer 337. In one embodiment of the invention second conductive layer 345 is copper, or another suitable metal, and is applied to an approximate thickness of five (5) microns or less.

Figure 3I:
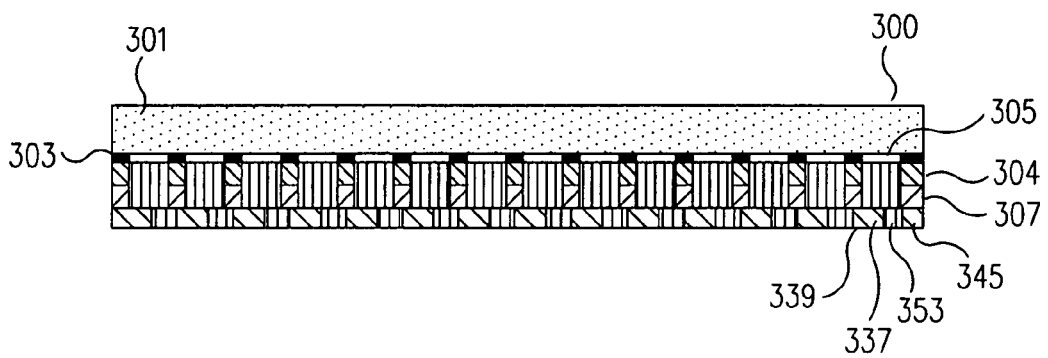
FIG. 3I shows the structure of FIG. 3H after the second layer of conductive material has been etched using a controlled etching process in accordance with the principles of one embodiment of the present invention.

According to the principles of one embodiment of the invention, second conductive layer 345 includes a second conductive layer first surface 346 that is in electrical contact with bonding locations 305 and a second conductive layer second surface 353. According to the principles of one embodiment of the invention, second conductive layer 345 is then etched away in a controlled etch process that results in second conductive layer second surface 353 of second conductive layer 345 being made level with second dielectric layer second surface 339 of second dielectric layer 337. As discussed in more detail below with respect to FIG. 4B, using controlled etching, and the methods of the present invention, portions of conductive layer second surface 353, such as bonding locations for solder balls and other interconnections, can, in one embodiment of the invention, be left higher that dielectric layer second surface 339 to facilitate better bonding and compliance. FIG. 3I shows the structure of FIG. 3H after second conductive layer 345 is etched using the controlled etching process in accordance with the principles of one embodiment of the present invention.

As shown above, according to the method and structure of the invention, the second conductive layer 345 building process is solely additive using the ablated second dielectric layer 337 as a mask. Consequently, the need for subsequent masks, patterning, and etching, as required in the prior art, is eliminated.

Since using the method and structure of the present invention, the materials used for second dielectric layer 337 need not be photoimagable materials, the materials need not limited to the prior art predetermined and specific thicknesses. Consequently, the resulting structures of the invention provide the opportunity for greater flexibility and "compliance" between solder bumps, or other interconnections, and the surfaces of the dies comprising the integrated circuit wafers.

Figure 3J:
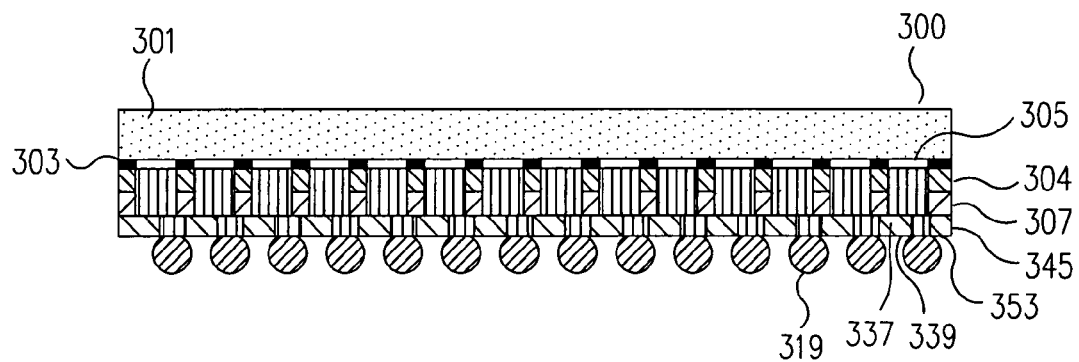
FIG. 3J shows the structure of FIG. 3I with solder bumps attached to points on the second conductive layer in accordance with the principles of one embodiment of the present invention.

FIG. 3J shows the structure of FIG. 3I with solder bumps 319 attached to selected points on second conductive layer 345 using standard techniques in accordance with the principles of one embodiment of the present invention.

Figure 3K:
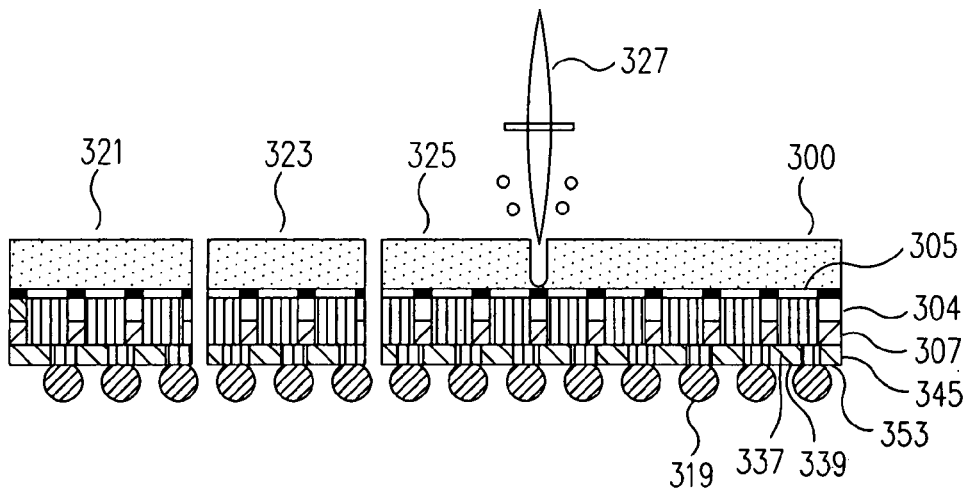
FIG. 3K shows the structure of FIG. 3J being singulated into multi-layer Direct Write Wafer Level Chip Scale Packaged electronic components, in accordance with the principles of one embodiment of the present invention.

FIG. 3K shows the structure of FIG. 3J being singulated into individual multilayer Direct Write Wafer Level Chip Scale Packaged electronic components 321, 323 and 325 using a standard cutting means 327, such as a saw.

Figure 3L:
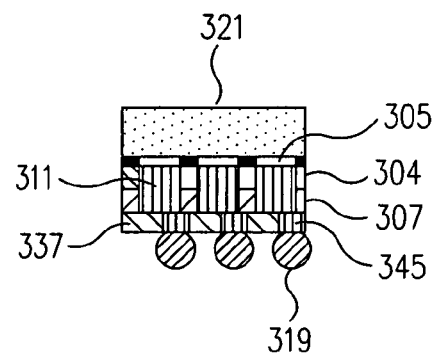
FIG. 3L shows a singulated multi-layer Direct Write Wafer Level Chip Scale Packaged electronic component in accordance with the principles of one embodiment of the present invention.
Figure 3M:
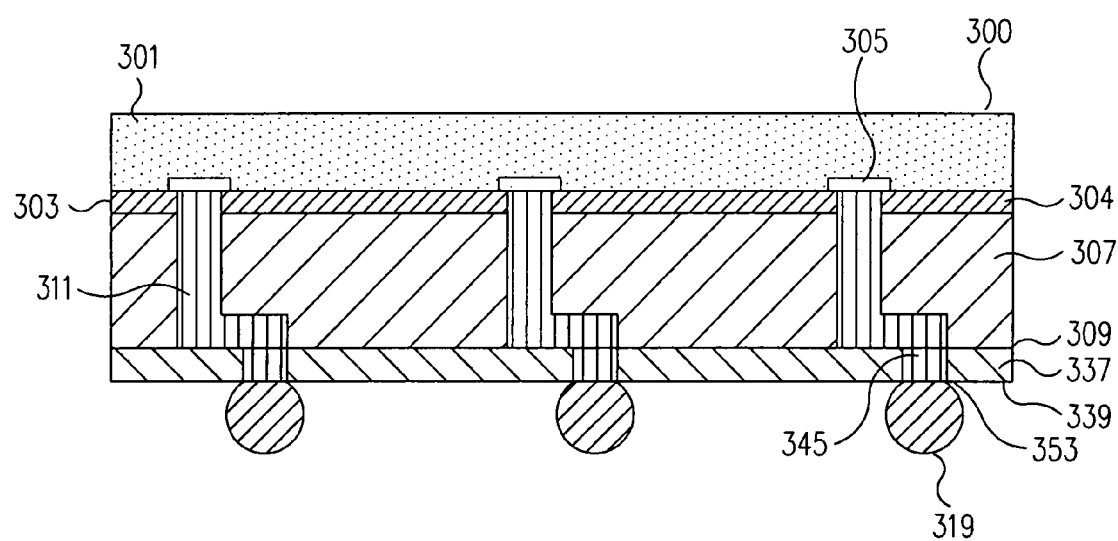
FIG. 3M shows the singulated multi-layer Direct Write Wafer Level Chip Scale Packaged electronic component of FIG. 3L in detail in accordance with the principles of one embodiment of the present invention.

FIG. 3L shows a singulated multilayer Direct Write Wafer Level Chip Scale Packaged electronic component 321 in accordance with the principles of one embodiment of the present invention. FIG. 3M shows the singulated multilayer Direct Write Wafer Level Chip Scale Packaged electronic component 321 of FIG. 3L in more detail.

The process and structure shown in FIGS. 3A to 3M is for a multilayer Direct Write Wafer Level Chip Scale Package 321 in which a first dielectric layer is attached using an adhesive layer, such as discussed above with respect to FIGS. 2A to 2H, and a second dielectric layer is directly attached, such as discussed above with respect to FIGS. 1A to 1H. However, those of skill in the art will readily recognize, in light of this disclosure, that the multilayer Direct Write Wafer Level Chip Scale Packages of the invention can also be formed where all dielectric layers are attached using an adhesive layer, such as discussed above with respect to FIGS. 2A to 2H, or all dielectric layers are directly attached, such as discussed above with respect to FIGS. 1A to 1H.

As discussed above, in some embodiments of the invention, the dielectric layers, such as dielectric layer 107, dielectric layer 207, and dielectric layer 337 are ablated in such a way as to form patterned vias to the die pads. The vias can be patterned in any way that the user of the invention deems necessary. For instance, in one embodiment of the invention, rather than simply ablating a single cylindrical or rectangular via to the die pads, a pattern of multiple smaller cylindrical or rectangular vias are formed. This particular structure provides for thermal expansion and therefore provides better compliance properties between solder bumps, or other interconnections, and the surfaces of the dies comprising the silicon wafers.

Figure 4A:
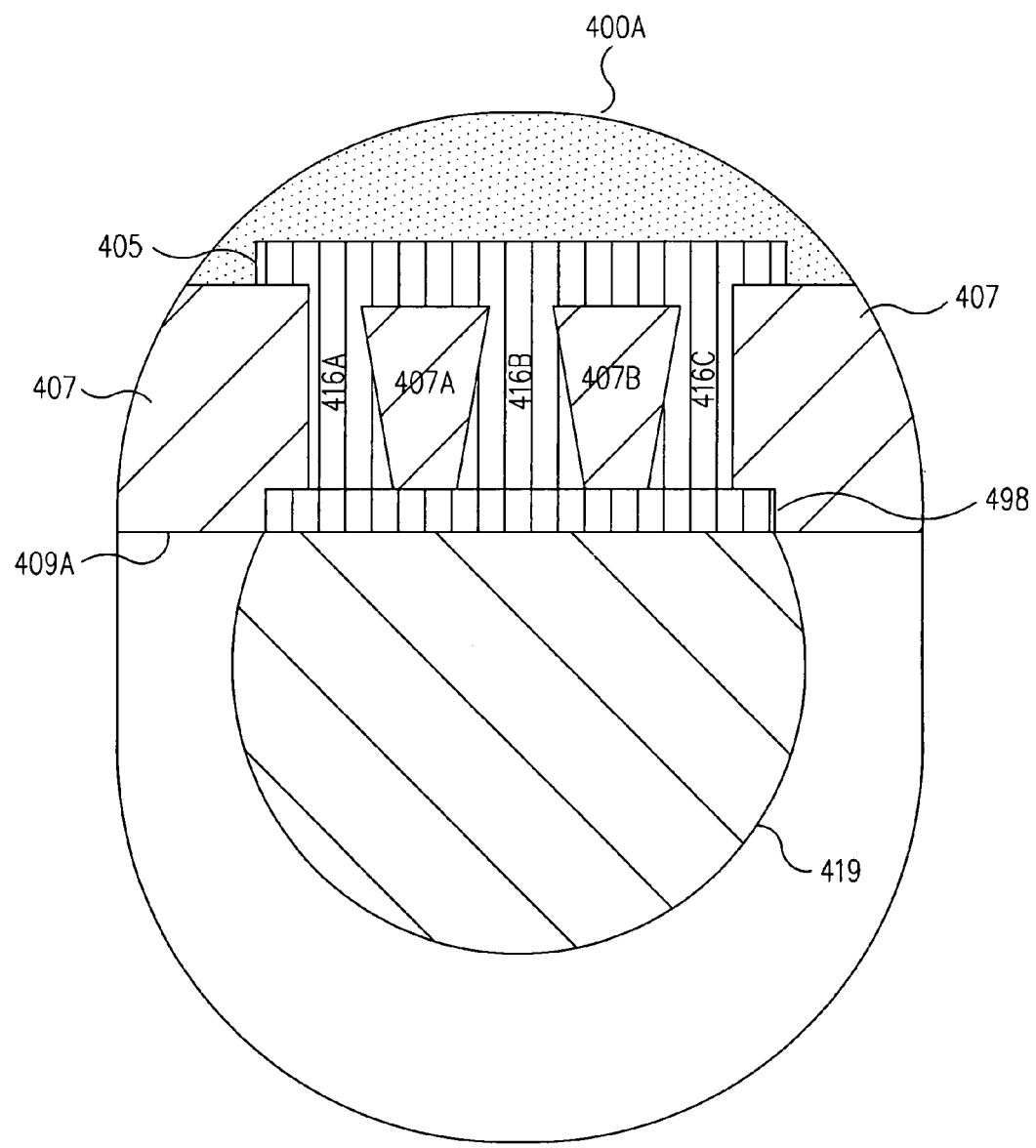
FIG. 4A shows a detail portion of a Direct Write Wafer Level Chip Scale Packaged electronic component wherein a dielectric layer has been ablated in such a way as to form patterned vias.

FIG. 4A shows a detail portion 400A, such as portion 299 of FIG. 2F, of a Direct Write Wafer Level Chip Scale Packaged electronic component of the invention, such as Direct Write Wafer Level Chip Scale Packaged electronic component 121 or 221discussed above, wherein a dielectric layer 407, such as dielectric layer 107 or dielectric layer 207 discussed above, has it's dielectric layer second surface 409A ablated in such a way as to form a patterned via 416A, such as electrically conductive vias 116 and 216 discussed above, between bonding location or pad 405, such as bonding locations or pads 105 and 205 discussed above, and bonding point 498, such as bonding points 198 and 298 discussed above.

As shown in FIG. 4A, in one embodiment, patterned via 416 includes multiple sub-vias 416A, 416B and 416C as opposed to a single cylindrical or rectangular opening. This particular structure allows for better thermal expansion by providing dielectric columns 407A and 407B to absorb thermal expansion of sub-vias 416A, 416B and 416C. Consequently, this particular embodiment of the invention provides better compliance properties between solder bump 419 and bonding point 498 and bonding location or pad 405 on the surfaces of the dies comprising the silicon wafers (not shown).

Those of skill in the art will readily recognize that many different patterns can be ablated in dielectric layer 407 to form many different vias 416A depending on the needs of the designer.

As discussed above, in some embodiments of the invention, portions of conductive layer second surfaces 113, 213 such as bonding points 198 and 298 for solder bumps 119 and 219 discussed above, and other interconnections, are be left higher that dielectric layer second surfaces 109, 209, respectively, to facilitate better bonding and compliance.

Figure 4B:
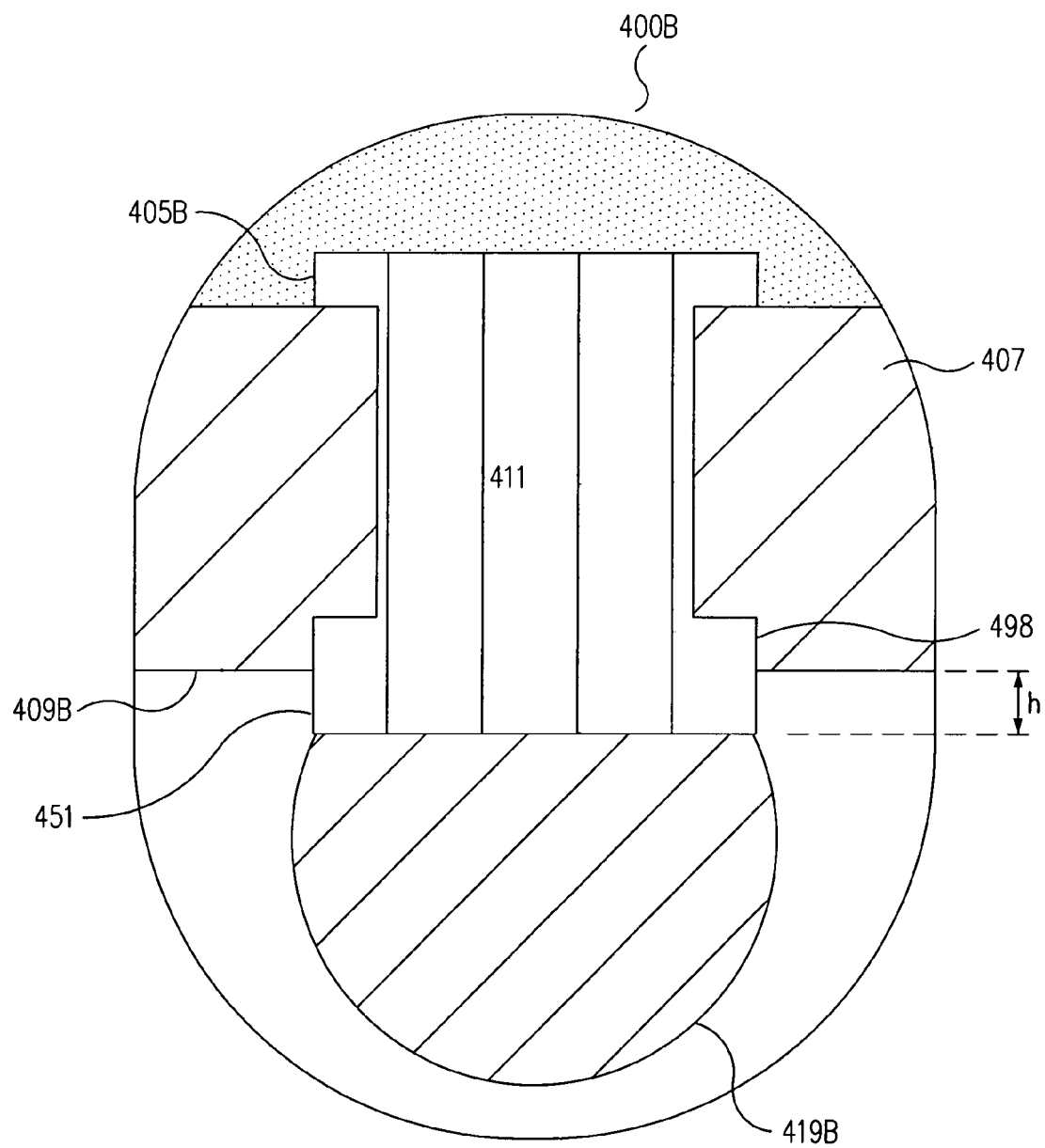
FIG. 4B shows a detail portion of a Direct Write Wafer Level Chip Scale Packaged electronic component wherein a metal buildup region is formed on bonding points of a conductive layer second surface.

FIG. 4B shows detail portion 400B, such as portion 299 of FIG. 2F, of a Direct Write Wafer Level Chip Scale Packaged electronic component of the invention, such as Direct Write Wafer Level Chip Scale Packaged electronic component 121 or 221 discussed above, wherein bonding point 498 includes a metal buildup region 451 that extends a height "h" above dielectric second surface 409B. Metal buildup region 451 is formed by either selective etching away of conductive layer second surfaces 113, 213 (see FIGS. 1D and 1E and FIGS. 2D and 2E) or by an additive process wherein metal buildup region 451 is applied after conductive layer second surface 113 or 213 is etched away.

As shown above, the present invention provides a method and structure for Direct Write Wafer Level Chip Scale Package (DWWLCSP) that utilizes permanent layers/coatings and direct write techniques to pattern these layers/coatings.

As noted above, the Direct Write Wafer Level Chip Scale Packages of the invention include materials laminated directly onto the wafer surface. The layers are then ablated, as opposed to imaged using photolithography. Consequently, using the method and structure of the present invention, the materials used need not be photoimagable materials, thus saving the cost of the materials themselves and the cost of the masking steps.

In addition, using the methods and structures of the present invention, the dielectric layers can be attached to the wafer with an adhesive layer and this adhesive layer need not be patterned using standard techniques. In addition, according to the method and structure of the invention, the metal layer building process is solely additive using the ablated dielectric layer as its mask. Consequently, the need for subsequent patterning and etching is eliminated.

In addition, since using the method and structure of the present invention, the materials used need not be photoimagable materials, the materials need not be limited to the prior art predetermined and specific thicknesses. Consequently, the resulting structures of the invention provide the opportunity for greater flexibility and "compliance" between solder bumps, or other interconnections, and the surfaces of the dies comprising the integrated circuit wafers.

This disclosure provides exemplary embodiments of the present invention. The scope of the present invention is not limited by these exemplary embodiments. Consequently, numerous variations, whether explicitly provided for by the specification or implied by the specification or not, may be implemented by one of skill in the art in view of this disclosure.

What is claimed is:

1. A method for packaging an electronic component comprising:
    providing a silicon wafer, the silicon wafer having a silicon wafer first surface and a silicon wafer second surface, opposite the silicon wafer first surface;
    forming a first bonding location, the first bonding location being formed on the silicon wafer second surface, the first bonding location having a first bonding location centerpoint corresponding to a center of the first bonding location;
    applying a first dielectric layer, the first dielectric layer having a first dielectric layer first surface and a first dielectric layer second surface, opposite the first dielectric layer first surface, the first dielectric layer first surface being applied to the silicon wafer second surface;
    ablating a first conductive structure portion pattern in the first dielectric layer;
    applying a first conductive layer, the first conductive layer having a first conductive layer first surface and a first conductive layer second surface, opposite the first conductive layer first surface, the first conductive layer first surface being applied to the first dielectric layer second surface, the first conductive layer filling the first conductive structure portion pattern ablated in the first dielectric layer to create a first conductive structure portion, the first conductive structure portion having a first conductive structure portion first surface and a first conductive structure portion second surface, opposite the first conductive structure portion first surface, at least part of the first conductive structure portion first surface being electrically coupled to at least part of the first bonding location;
    applying a second dielectric layer, the second dielectric layer having a second dielectric layer first surface and a second dielectric layer second surface, opposite the second dielectric layer first surface, the second dielectric layer first surface being applied to the first conductive layer second surface;
    ablating a second conductive structure portion pattern in the second dielectric layer, the second conductive structure portion pattern extending from the second dielectric layer second surface to at least a portion of the first conductive structure portion second surface; and
    applying a second conductive layer, the second conductive layer having a second conductive layer first surface and a second conductive layer second surface, opposite the second conductive layer first surface, the second conductive layer first surface being applied to the second dielectric layer second surface, the second conductive layer filling the second conductive structure portion pattern ablated in the second dielectric layer to create a second conductive structure portion, the second conductive structure portion having a second conductive structure portion first surface and a second conductive structure portion second surface, opposite the second conductive structure portion first surface, the second conductive structure portion second surface having a second conductive structure portion second surface centerpoint corresponding to a center of the second conductive structure portion second surface, wherein;
    the second conductive structure portion second surface centerpoint is offset from the first bonding location centerpoint to form an offset conductive structure, the offset conductive structure providing a conductive path from the first bonding location to the second conductive structure portion second surface.

2. The method for packaging an electronic component of claim 1, wherein;
    the first dielectric layer first surface is applied directly to the silicon wafer second surface by lamination.

3. The method for packaging an electronic component of claim 2, wherein;
    the first conductive structure portion is a conductive via.

4. The method for packaging an electronic component of claim 2, wherein;
    the second conductive structure portion is a conductive trace.

5. The method for packaging an electronic component of claim 1, wherein;
    the first dielectric layer first surface is applied to the silicon wafer second surface by an adhesive.

6. The method for packaging an electronic component of claim 5, wherein;
the first conductive structure portion is a conductive via.

7. The method for packaging an electronic component of claim 5, wherein;
the second conductive structure portion is a conductive trace.

8. A method for packaging an electronic component comprising:
applying a first dielectric layer to a surface of a silicon wafer comprising a first bonding location;
ablating a first pattern in the first dielectric layer;
filling the first pattern to create a first conductive structure, the first conductive structure being electrically coupled to the first bonding location;
applying a second dielectric layer to the first dielectric layer and the first conductive structure;
ablating a second pattern in the second dielectric layer, the second pattern extending through the second dielectric layer and to the first conductive structure; and
filling the second pattern to create a second conductive structure, the second conductive structure comprising a second bonding location, wherein the second bonding location is offset from the first bonding location, the first conductive structure and the second conductive structure forming an offset conductive structure, the offset conductive structure providing a conductive path from the first bonding location to the second bonding location.

9. The method for packaging an electronic component of claim 8, wherein;
the first dielectric layer is applied directly to the silicon wafer by lamination.

10. The method for packaging an electronic component of claim 8, wherein;
the first conductive structure comprises a conductive via extending through the first dielectric layer and to the first bonding location.

11. The method for packaging an electronic component of claim 8, wherein;
the second conductive structure comprises a conductive trace.

12. The method for packaging an electronic component of claim 8, wherein;
the first dielectric layer is applied to the silicon wafer by an adhesive.

13. The method for packaging an electronic component of claim 12, wherein;
the first conductive structure comprises a conductive via extending through the first dielectric layer and the adhesive and to the first bonding location.

14. The method for packaging an electronic component of claim 12, wherein;
the second conductive structure comprises a conductive trace.

* * * * *